(12) United States Patent
Ashworth et al.

(10) Patent No.: US 11,894,910 B2
(45) Date of Patent: Feb. 6, 2024

(54) CELLULAR AND PUBLIC SAFETY REPEATER

(71) Applicant: WILSON ELECTRONICS, LLC, St. George, UT (US)

(72) Inventors: Christopher Ken Ashworth, Toquerville, UT (US); Dale Robert Anderson, Colleyville, TX (US); Casey James Nordgran, Ivins, UT (US)

(73) Assignee: Wilson Electronics, LLC, St. George, UT (US)

( * ) Notice: Subject to any disclaimer, the term of this patent is extended or adjusted under 35 U.S.C. 154(b) by 361 days.

(21) Appl. No.: 16/727,620

(22) Filed: Dec. 26, 2019

(65) Prior Publication Data

US 2020/0212993 A1 Jul. 2, 2020

Related U.S. Application Data

(60) Provisional application No. 62/786,910, filed on Dec. 31, 2018.

(51) Int. Cl.
*H04B 7/155* (2006.01)
*H03G 3/30* (2006.01)
(Continued)

(52) U.S. Cl.
CPC ....... *H04B 7/15507* (2013.01); *H03G 3/3042* (2013.01); *H04B 1/0057* (2013.01);
(Continued)

(58) Field of Classification Search
CPC .............. H04B 7/15507; H04B 1/0057; H04B 7/15535; H04B 7/15571; H04B 7/15528;
(Continued)

(56) References Cited

U.S. PATENT DOCUMENTS

| 4,776,032 A | 10/1988 | Odate et al. |
|---|---|---|
| 5,303,395 A | 4/1994 | Dayani |

(Continued)

FOREIGN PATENT DOCUMENTS

| EP | 1525678 B1 | 7/2008 | |
|---|---|---|---|
| EP | 3675383 A1 * | 7/2020 | ......... H04B 7/15571 |

OTHER PUBLICATIONS

European search report for EP3675383A1 (application No. EP20200701); dated Apr. 28, 2020 (Year: 2020).*

(Continued)

*Primary Examiner* — Benjamin H Elliott, IV
(74) *Attorney, Agent, or Firm* — Thorpe North & Western LLP

(57) ABSTRACT

Technology for a repeater is disclosed. The repeater can include a first-direction signal path configured to amplify and filter a signal in a first-direction band using a first bandpass filter. The repeater can include a second-direction signal path configured to amplify and filter a signal in a second-direction band using a second bandpass filter. The second-direction band can be spectrally adjacent to the first-direction band. The first bandpass filter and the second bandpass filter can provide filtering to isolate the first-direction band from the spectrally adjacent second-direction band.

32 Claims, 7 Drawing Sheets

(51) Int. Cl.
  *H04B 1/00* (2006.01)
  *H04W 52/52* (2009.01)
  *H03F 3/20* (2006.01)

(52) U.S. Cl.
  CPC ........ *H04B 7/15535* (2013.01); *H04W 52/52* (2013.01); *H03F 3/20* (2013.01); *H03F 2200/294* (2013.01); *H03F 2200/451* (2013.01)

(58) Field of Classification Search
  CPC ..... H04B 7/155; H03F 3/20; H03F 2200/451; H03F 2200/294; H04W 52/52; H03G 3/3042
  See application file for complete search history.

(56) References Cited

U.S. PATENT DOCUMENTS

| | | | |
|---|---|---|---|
| 5,737,687 A | 4/1998 | Martin et al. | |
| 5,777,530 A | 7/1998 | Nakatuka | |
| 5,835,848 A | 11/1998 | Bi et al. | |
| 6,005,884 A | 12/1999 | Cook et al. | |
| 6,711,388 B1 | 3/2004 | Neitiniemi | |
| 6,889,033 B2 | 5/2005 | Bongfeldt | |
| 6,990,313 B1 | 1/2006 | Yarkosky | |
| 7,035,587 B1 | 4/2006 | Yarkosky | |
| 7,221,967 B2 | 5/2007 | Van Buren et al. | |
| 7,974,573 B2 | 7/2011 | Dean | |
| 9,054,664 B1* | 6/2015 | Ashworth | H03G 3/3042 |
| 9,444,543 B2* | 9/2016 | Ashworth | H03F 3/19 |
| 2002/0044594 A1 | 4/2002 | Bongfeldt | |
| 2003/0123401 A1 | 7/2003 | Dean | |
| 2004/0137854 A1 | 7/2004 | Ge | |
| 2004/0146013 A1 | 7/2004 | Song et al. | |
| 2004/0166802 A1 | 8/2004 | McKay, Sr. et al. | |
| 2004/0219876 A1 | 11/2004 | Baker et al. | |
| 2004/0235417 A1 | 11/2004 | Dean | |
| 2005/0047533 A1* | 3/2005 | Ruelke | H03G 3/3052 |
| | | | 375/345 |
| 2005/0118949 A1 | 6/2005 | Allen et al. | |
| 2006/0068800 A1* | 3/2006 | Ruelke | H04W 36/20 |
| | | | 455/450 |
| 2006/0084379 A1 | 4/2006 | O'Neill | |
| 2007/0071128 A1 | 3/2007 | Meir et al. | |
| 2007/0188235 A1 | 8/2007 | Dean | |
| 2008/0081555 A1 | 4/2008 | Kong et al. | |
| 2008/0096483 A1 | 4/2008 | Van Buren et al. | |
| 2008/0278237 A1 | 11/2008 | Blin | |
| 2011/0151775 A1 | 6/2011 | Kang et al. | |
| 2012/0002586 A1* | 1/2012 | Gainey | H04B 1/525 |
| | | | 370/315 |
| 2015/0009889 A1* | 1/2015 | Zhan | H04B 7/15542 |
| | | | 370/315 |
| 2015/0029909 A1* | 1/2015 | Ashworth | H04B 7/15535 |
| | | | 370/279 |
| 2017/0055231 A1* | 2/2017 | Cook | H04B 7/155 |
| 2017/0111864 A1* | 4/2017 | Ashworth | H04W 52/0229 |
| 2018/0070323 A1* | 3/2018 | Zhan | H04W 52/46 |
| 2018/0139626 A1* | 5/2018 | Ashworth | H04B 7/14 |
| 2018/0316368 A1* | 11/2018 | Ko | H04B 17/13 |
| 2020/0028568 A1* | 1/2020 | Zhan | H04B 7/15557 |
| 2020/0212993 A1* | 7/2020 | Ashworth | H04W 52/52 |

OTHER PUBLICATIONS

3GPP2 C.S0011-B; "Recommended Minimum Performance Standards for cdma2000® Spread Spectrum Mobile Stations"; TIA-98-E; (Dec. 13, 2002); 448 pages; Release B, V1.0, Revision E.
ADL5513; "1 MHz to 4 GHz, 80 dB Logarithmic Detector/Controller"; Data Sheet; (2008); 12 pages; Analog Devices, Inc.
HMC713LP3E; "54 dB, Logarithmic Detector / Controller, 50-8000 MHz"; Data Sheet; (2010); 12 pages.
HMC909LP4E; "RMS Power Detector Single-Ended, DC-5.8 GHz"; Data Sheet; (2010); 21 pages.
PIC16F873; "28/40-Pin 8-Bit CMOS Flash Microcontrollers"; (2001); Data Sheet; 218 pages.

* cited by examiner

CELLULAR AND PUBLIC SAFETY REPEATER

RELATED APPLICATIONS

The present application claims the benefit of U.S. Provisional Patent Application No. 62/786,910, filed Dec. 31, 2018, the entire specification of which is hereby incorporated by reference in its entirety for all purposes.

BACKGROUND

Signal boosters and repeaters can be used to increase the quality of wireless communication between a wireless device and a wireless communication access point, such as a cell tower. Signal boosters can enhance the quality of the wireless communication by amplifying, filtering, and/or applying other processing techniques to uplink and downlink signals communicated between the wireless device and the wireless communication access point.

As an example, the signal booster can receive, via an antenna, downlink signals from the wireless communication access point. The signal booster can amplify the downlink signal and then provide an amplified downlink signal to the wireless device. In other words, the signal booster can act as a relay between the wireless device and the wireless communication access point. As a result, the wireless device can receive a stronger signal from the wireless communication access point. Similarly, uplink signals from the wireless device (e.g., telephone calls and other data) can be directed to the signal booster. The signal booster can amplify the uplink signals before communicating, via an antenna, the uplink signals to the wireless communication access point.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Figure 1:
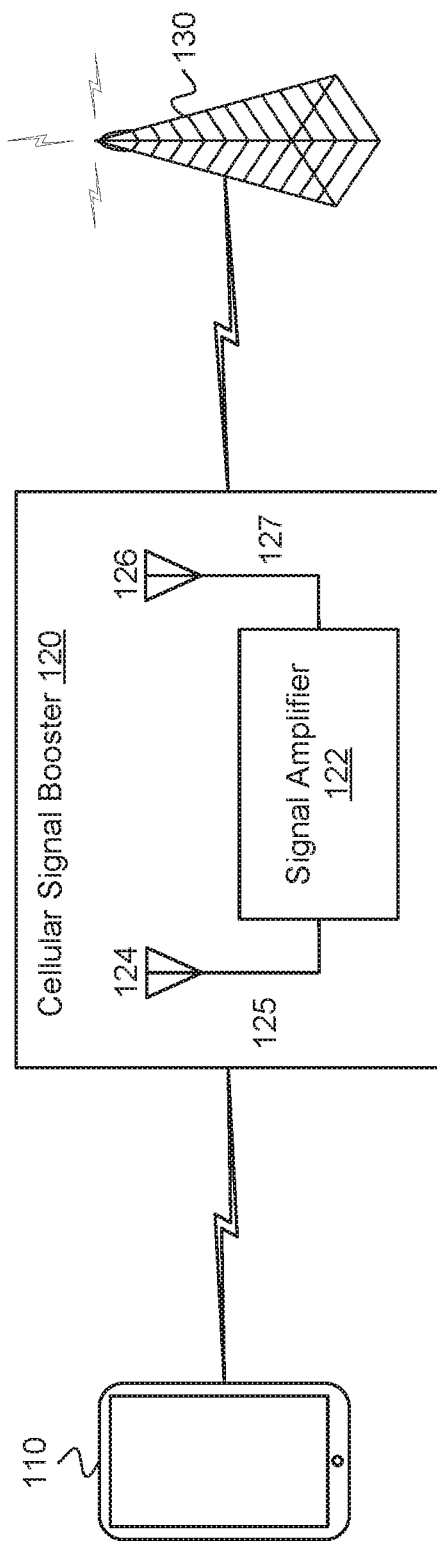
FIG. 1 illustrates a signal booster in communication with a wireless device and a base station in accordance with an example.

Reference will now be made to the exemplary embodiments illustrated, and specific language will be used herein to describe the same. It will nevertheless be understood that no limitation of the scope of the invention is thereby intended.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

Example Embodiments

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

FIG. 1 illustrates an exemplary signal booster 120 in communication with a wireless device 110 and a base station 130. The term "signal booster" and "repeater" may be used interchangeably herein. The signal booster 120 can be referred to as a repeater. A repeater can be an electronic device used to amplify (or boost) signals. The signal booster 120 (also referred to as a cellular signal amplifier) can enhance the quality of wireless communication by amplifying, filtering, and/or applying other processing techniques via a signal amplifier 122 to uplink signals communicated from the wireless device 110 to the base station 130 and/or downlink signals communicated from the base station 130 to the wireless device 110. In other words, the signal booster 120 can amplify or boost uplink signals and/or downlink signals bi-directionally. In one example, the signal booster 120 can be at a fixed location, such as in a home or office. Alternatively, the signal booster 120 can be attached to a mobile object, such as a vehicle or a wireless device 110.

In one example, the base station 130 can include "NodeBs," "evolved NodeBs (eNodeB or eNB)," "New Radio Base Stations (NR BS) and/or "Next Generation NodeBs (gNodeB or gNB)," and can refer to a device or configured node of a mobile phone network that communicates wirelessly with the wireless device 110. In another example, the wireless device 110 can refer to a user equipment, mobile device or a similar type of computing device capable of wireless digital communication. The wireless device 100 may include a smart phone, a tablet computing device, a laptop computer, a multimedia device such as an iPod Touch®, or other type computing device that provides text or voice communication.

In one configuration, the signal booster 120 can include an integrated device antenna 124 (e.g., an inside antenna or a coupling antenna) and an integrated node antenna 126 (e.g., an outside antenna). The integrated node antenna 126 can receive the downlink signal from the base station 130. The downlink signal can be provided to the signal amplifier 122 via a second coaxial cable 127 or other type of radio frequency connection operable to communicate radio frequency signals. The signal amplifier 122 can include one or more cellular signal amplifiers for amplification and filtering. The downlink signal that has been amplified and filtered can be provided to the integrated device antenna 124 via a first coaxial cable 125 or other type of radio frequency connection operable to communicate radio frequency signals. The integrated device antenna 124 can wirelessly communicate the downlink signal that has been amplified and filtered to the wireless device 110.

Similarly, the integrated device antenna 124 can receive an uplink signal from the wireless device 110. The uplink signal can be provided to the signal amplifier 122 via the first coaxial cable 125 or other type of radio frequency connection operable to communicate radio frequency signals. The signal amplifier 122 can include one or more cellular signal amplifiers for amplification and filtering. The uplink signal that has been amplified and filtered can be provided to the integrated node antenna 126 via the second coaxial cable 127 or other type of radio frequency connection operable to communicate radio frequency signals. The integrated device antenna 126 can communicate the uplink signal that has been amplified and filtered to the base station 130.

In one example, the signal booster 120 can filter the uplink and downlink signals using any suitable analog or digital filtering technology including, but not limited to, surface acoustic wave (SAW) filters, bulk acoustic wave (BAW) filters, film bulk acoustic resonator (FBAR) filters, ceramic filters, waveguide filters or low-temperature co-fired ceramic (LTCC) filters.

In one example, the signal booster 120 can send uplink signals to a node and/or receive downlink signals from the node. The node can comprise a wireless wide area network (WWAN) access point (AP), a base station (BS), an evolved Node B (eNB), a baseband unit (BBU), a remote radio head (RRH), a remote radio equipment (RRE), a relay station (RS), a radio equipment (RE), a remote radio unit (RRU), a central processing module (CPM), or another type of WWAN access point.

In one configuration, the signal booster 120 used to amplify the uplink and/or a downlink signal is a handheld booster. The handheld booster can be implemented in a sleeve of the wireless device 110. The wireless device sleeve can be attached to the wireless device 110, but can be removed as needed. In this configuration, the signal booster 120 can automatically power down or cease amplification when the wireless device 110 approaches a particular base station. In other words, the signal booster 120 can determine to stop performing signal amplification when the quality of uplink and/or downlink signals is above a defined threshold based on a location of the wireless device 110 in relation to the base station 130.

In one example, the signal booster 120 can include a battery to provide power to various components, such as the signal amplifier 122, the integrated device antenna 124 and the integrated node antenna 126. The battery can also power the wireless device 110 (e.g., phone or tablet). Alternatively, the signal booster 120 can receive power from the wireless device 110.

In one configuration, the signal booster 120 can be a Federal Communications Commission (FCC)-compatible consumer signal booster. As a non-limiting example, the signal booster 120 can be compatible with FCC Part 20 or 47 Code of Federal Regulations (C.F.R.) Part 20.21 (Mar. 21, 2013). In addition, the signal booster 120 can operate on the frequencies used for the provision of subscriber-based services under parts 22 (Cellular), 24 (Broadband PCS), 27 (AWS-1, 700 MHz Lower A-E Blocks, and 700 MHz Upper C Block), and 90 (Specialized Mobile Radio) of 47 C.F.R. The signal booster 120 can be configured to automatically self-monitor its operation to ensure compliance with applicable noise and gain limits. The signal booster 120 can either self-correct or shut down automatically if the signal booster's operations violate the regulations defined in FCC Part 20.21.

In one configuration, the signal booster 120 can enhance the wireless connection between the wireless device 110 and the base station 130 (e.g., cell tower) or another type of wireless wide area network (WWAN) access point (AP). The signal booster 120 can boost signals for cellular standards, such as the Third Generation Partnership Project (3GPP) Long Term Evolution (LTE) Release 8, 9, 10, 11, 12, 13, 14, 15 or 16, 3GPP 5G Release 15 or 16, or Institute of Electronics and Electrical Engineers (IEEE) 802.16. In one configuration, the signal booster 120 can boost signals for 3GPP LTE Release 16.0.0 (January 2019) or other desired releases. The signal booster 120 can boost signals from the 3GPP Technical Specification (TS) 36.101 (Release 16 Jul. 2019) bands or LTE frequency bands. For example, the signal booster 120 can boost signals from the LTE frequency bands: 2, 4, 5, 12, 13, 17, 25, and 26. In addition, the signal booster 120 can boost selected frequency bands based on the country or region in which the signal booster is used, including any of bands 1-85 or other bands, as disclosed in 3GPP TS 36.104 V16.0.0 (January 2019), and depicted in Table 1:

TABLE 1

| LTE Operating Band | Uplink (UL) operating band BS receive UE transmit $F_{UL\_low}$-$F_{UL\_high}$ | Downlink (DL) operating band BS transmit UE receive $F_{DL\_low}$-$F_{DL\_high}$ | Duplex Mode |
|---|---|---|---|
| 1 | 1920 MHz-1980 MHz | 2110 MHz-2170 MHz | FDD |
| 2 | 1850 MHz-1910 MHz | 1930 MHz-1990 MHz | FDD |
| 3 | 1710 MHz-1785 MHz | 1805 MHz-1880 MHz | FDD |
| 4 | 1710 MHz-1755 MHz | 2110 MHz-2155 MHz | FDD |
| 5 | 824 MHz-849 MHz | 869 MHz-894 MHz | FDD |
| 6 (NOTE 1) | 830 MHz-840 MHz | 875 MHz-885 MHz | FDD |
| 7 | 2500 MHz-2570 MHz | 2620 MHz-2690 MHz | FDD |
| 8 | 880 MHz-915 MHz | 925 MHz-960 MHz | FDD |
| 9 | 1749.9 MHz-1784.9 MHz | 1844.9 MHz-1879.9 MHz | FDD |
| 10 | 1710 MHz-1770 MHz | 2110 MHz-2170 MHz | FDD |
| 11 | 1427.9 MHz-1447.9 MHz | 1475.9 MHz-1495.9 MHz | FDD |
| 12 | 699 MHz-716 MHz | 729 MHz-746 MHz | FDD |
| 13 | 777 MHz-787 MHz | 746 MHz-756 MHz | FDD |
| 14 | 788 MHz-798 MHz | 758 MHz-768 MHz | FDD |
| 15 | Reserved | Reserved | FDD |
| 16 | Reserved | Reserved | FDD |
| 17 | 704 MHz-716 MHz | 734 MHz-746 MHz | FDD |

TABLE 1-continued

| LTE Operating Band | Uplink (UL) operating band BS receive UE transmit $F_{UL\_low}$-$F_{UL\_high}$ | Downlink (DL) operating band BS transmit UE receive $F_{DL\_low}$-$F_{DL\_high}$ | Duplex Mode |
|---|---|---|---|
| 18 | 815 MHz-830 MHz | 860 MHz-875 MHz | FDD |
| 19 | 830 MHz-845 MHz | 875 MHz-890 MHz | FDD |
| 20 | 832 MHz-862 MHz | 791 MHz-821 MHz | FDD |
| 21 | 1447.9 MHz-1462.9 MHz | 1495.9 MHz-1510.9 MHz | FDD |
| 22 | 3410 MHz-3490 MHz | 3510 MHz-3590 MHz | FDD |
| 23[1] | 2000 MHz-2020 MHz | 2180 MHz-2200 MHz | FDD |
| 24 | 1626.5 MHz-1660.5 MHz | 1525 MHz-1559 MHz | FDD |
| 25 | 1850 MHz-1915 MHz | 1930 MHz-1995 MHz | FDD |
| 26 | 814 MHz-849 MHz | 859 MHz-894 MHz | FDD |
| 27 | 807 MHz-824 MHz | 852 MHz-869 MHz | FDD |
| 28 | 703 MHz-748 MHz | 758 MHz-803 MHz | FDD |
| 29 | N/A | 717 MHz-728 MHz | FDD (NOTE 2) |
| 30 | 2305 MHz-2315 MHz | 2350 MHz-2360 MHz | FDD |
| 31 | 452.5 MHz-457.5 MHz | 462.5 MHz-467.5 MHz | FDD |
| 32 | N/A | 1452 MHz-1496 MHz | FDD (NOTE 2) |
| 33 | 1900 MHz-1920 MHz | 1900 MHz-1920 MHz | TDD |
| 34 | 2010 MHz-2025 MHz | 2010 MHz-2025 MHz | TDD |
| 35 | 1850 MHz-1910 MHz | 1850 MHz-1910 MHz | TDD |
| 36 | 1930 MHz-1990 MHz | 1930 MHz-1990 MHz | TDD |
| 37 | 1910 MHz-1930 MHz | 1910 MHz-1930 MHz | TDD |
| 38 | 2570 MHz-2620 MHz | 2570 MHz-2620 MHz | TDD |
| 39 | 1880 MHz-1920 MHz | 1880 MHz-1920 MHz | TDD |
| 40 | 2300 MHz-2400 MHz | 2300 MHz-2400 MHz | TDD |
| 41 | 2496 MHz-2690 MHz | 2496 MHz-2690 MHz | TDD |
| 42 | 3400 MHz-3600 MHz | 3400 MHz-3600 MHz | TDD |
| 43 | 3600 MHz-3800 MHz | 3600 MHz-3800 MHz | TDD |
| 44 | 703 MHz-803 MHz | 703 MHz-803 MHz | TDD |
| 45 | 1447 MHz-1467 MHz | 1447 MHz-1467 MHz | TDD |
| 46 | 5150 MHz-5925 MHz | 5150 MHz-5925 MHz | TDD (NOTE 3, NOTE 4) |
| 47 | 5855 MHz-5925 MHz | 5855 MHz-5925 MHz | TDD |
| 48 | 3550 MHz-3700 MHz | 3550 MHz-3700 MHz | TDD |
| 49 | 3550 MHz-3700 MHz | 3550 MHz-3700 MHz | TDD (NOTE 8) |
| 50 | 1432 MHz-1517 MHz | 1432 MHz-1517 MHz | TDD |
| 51 | 1427 MHz-1432 MHz | 1427 MHz-1432 MHz | TDD |
| 52 | 3300 MHz-3400 MHz | 3300 MHz-3400 MHz | TDD |
| 53 | 2483.5 MHz-2495 MHz | 2483.5 MHz-2495 MHz | TDD |
| 65 | 1920 MHz-2010 MHz | 2110 MHz-2200 MHz | FDD |
| 66 | 1710 MHz-1780 MHz | 2110 MHz-2200 MHz | FDD (NOTE 5) |
| 67 | N/A | 738 MHz-758 MHz | FDD (NOTE 2) |
| 68 | 698 MHz-728 MHz | 753 MHz-783 MHz | FDD |
| 69 | N/A | 2570 MHz-2620 MHz | FDD (NOTE 2) |
| 70 | 1695 MHz-1710 MHz | 1995 MHz-2020 MHz | FDD[6] |
| 71 | 663 MHz-698 MHz | 617 MHz-652 MHz | FDD |
| 72 | 451 MHz-456 MHz | 461 MHz-466 MHz | FDD |
| 73 | 450 MHz-455 MHz | 460 MHz-465 MHz | FDD |
| 74 | 1427 MHz-1470 MHz | 1475 MHz-1518 MHz | FDD |
| 75 | N/A | 1432 MHz-1517 MHz | FDD (NOTE 2) |
| 76 | N/A | 1427 MHz-1432 MHz | FDD (NOTE 2) |

TABLE 1-continued

| LTE Operating Band | Uplink (UL) operating band BS receive UE transmit $F_{UL\_low}$-$F_{UL\_high}$ | Downlink (DL) operating band BS transmit UE receive $F_{DL\_low}$-$F_{DL\_high}$ | Duplex Mode |
|---|---|---|---|
| 85 | 698 MHz-716 MHz | 728 MHz-746 MHz | FDD |
| 87 | 410 MHz-415 MHz | 420 MHz-425 MHz | FDD |
| 88 | 412 MHz-417 MHz | 422 MHz-427 MHz | FDD |

(NOTE 1):
Band 6, 23 are not applicable.
(NOTE 2):
Restricted to E-UTRA operation when carrier aggregation is configured. The downlink operating band is paired with the uplink operating band (external) of the carrier aggregation configuration that is supporting the configured Pcell.
(NOTE 3):
This band is an unlicensed band restricted to licensed-assisted operation using Frame Structure Type 3.
(NOTE 4):
Band 46 is divided into four sub-bands as in Table 5.5-1A.
(NOTE 5):
The range 2180-2200 MHz of the DL operating band is restricted to E-UTRA operation when carrier aggregation is configured.
(NOTE 6):
The range 2010-2020 MHz of the DL operating band is restricted to E-UTRA operation when carrier aggregation is configured and TX-RX separation is 300 MHz. The range 2005-2020 MHz of the DL operating band is restricted to E-UTRA operation when carrier aggregation is configured and TX-RX separation is 295 MHz.
(NOTE 7):
Void
(NOTE 8):
This band is restricted to licensed-assisted operation using Frame Structure Type 3.

In another configuration, the signal booster 120 can boost signals from the 3GPP Technical Specification (TS) 38.104 (Release 16 Jul. 2019) bands or 5G frequency bands. In addition, the signal booster 120 can boost selected frequency bands based on the country or region in which the repeater is used, including any of bands n1-n86 in frequency range 1 (FR1), n257-n261 in frequency range 2 (FR2), or other bands, as disclosed in 3GPP TS 38.104 V16.0.0 (July 2019), and depicted in Table 2 and Table 3:

TABLE 2

| NR operating band | Uplink (UL) operating band BS receive/ UE transmit $F_{UL,\ low}$-$F_{UL,\ high}$ | Downlink (DL) operating band BS transmit/ UE receive $F_{DL,\ low}$-$F_{DL,\ high}$ | Duplex Mode |
|---|---|---|---|
| n1 | 1920 MHz-1980 MHz | 2110 MHz-2170 MHz | FDD |
| n2 | 1850 MHz-1910 MHz | 1930 MHz-1990 MHz | FDD |
| n3 | 1710 MHz-1785 MHz | 1805 MHz-1880 MHz | FDD |
| n5 | 824 MHz-849 MHz | 869 MHz-894 MHz | FDD |
| n7 | 2500 MHz-2570 MHz | 2620 MHz-2690 MHz | FDD |
| n8 | 880 MHz-915 MHz | 925 MHz-960 MHz | FDD |
| n12 | 699 MHz-716 MHz | 729 MHz-746 MHz | FDD |
| n14 | 788 MHz-798 MHz | 758 MHz-768 MHz | FDD |
| n18 | 815 MHz-830 MHz | 860 MHz-875 MHz | FDD |
| n20 | 832 MHz-862 MHz | 791 MHz-821 MHz | FDD |
| n25 | 1850 MHz-1915 MHz | 1930 MHz-1995 MHz | FDD |
| n28 | 703 MHz-748 MHz | 758 MHz-803 MHz | FDD |
| n30 | 2305 MHz-2315 MHz | 2350 MHz-2360 MHz | FDD |
| n34 | 2010 MHz-2025 MHz | 2010 MHz-2025 MHz | TDD |
| n38 | 2570 MHz-2620 MHz | 2570 MHz-2620 MHz | TDD |
| n39 | 1880 MHz-1920 MHz | 1880 MHz-1920 MHz | TDD |
| n40 | 2300 MHz-2400 MHz | 2300 MHz-2400 MHz | TDD |
| n41 | 2496 MHz-2690 MHz | 2496 MHz-2690 MHz | TDD |
| n48 | 3550 MHz-3700 MHz | 3550 MHz-3700 MHz | TDD |
| n50 | 1432 MHz-1517 MHz | 1432 MHz-1517 MHz | TDD |
| n51 | 1427 MHz-1432 MHz | 1427 MHz-1432 MHz | TDD |
| n65 | 1920 MHz-2010 MHz | 2110 MHz-2200 MHz | FDD |
| n66 | 1710 MHz-1780 MHz | 2110 MHz-2200 MHz | FDD |
| n70 | 1695 MHz-1710 MHz | 1995 MHz-2020 MHz | FDD |
| n71 | 663 MHz-698 MHz | 617 MHz-652 MHz | FDD |
| n74 | 1427 MHz-1470 MHz | 1475 MHz-1518 MHz | FDD |
| n75 | N/A | 1432 MHz-1517 MHz | SDL |
| n76 | N/A | 1427 MHz-1432 MHz | SDL |

TABLE 2-continued

| NR operating band | Uplink (UL) operating band BS receive/ UE transmit $F_{UL,\ low}$-$F_{UL,\ high}$ | Downlink (DL) operating band BS transmit/ UE receive $F_{DL,\ low}$-$F_{DL,\ high}$ | Duplex Mode |
|---|---|---|---|
| n77 | 3300 MHz-4200 MHz | 3300 MHz-4200 MHz | TDD |
| n78 | 3300 MHz-3800 MHz | 3300 MHz-3800 MHz | TDD |
| n79 | 4400 MHz-5000 MHz | 4400 MHz-5000 MHz | TDD |
| n80 | 1710 MHz-1785 MHz | N/A | SUL |
| n81 | 880 MHz-915 MHz | N/A | SUL |
| n82 | 832 MHz-862 MHz | N/A | SUL |
| n83 | 703 MHz-748 MHz | N/A | SUL |
| n84 | 1920 MHz-1980 MHz | N/A | SUL |
| n86 | 1710 MHz-1780 MHz | N/A | SUL |
| [n90] | 2496 MHz-2690 MHz | 2496 MHz-2690 MHz | TDD |

TABLE 3

| NR operating band | Uplink (UL) and Downlink (DL) operating band BS transmit/receive UE transmit/receive $F_{UL,\ low}$-$F_{UL,\ high}$ $F_{DL,\ low}$-$F_{DL,\ high}$ | Duplex Mode |
|---|---|---|
| n257 | 26500 MHz-29500 MHz | TDD |
| n258 | 24250 MHz-27500 MHz | TDD |
| n260 | 37000 MHz-40000 MHz | TDD |
| n261 | 27500 MHz-28350 MHz | TDD |

The number of LTE or 5G frequency bands and the level of signal enhancement can vary based on a particular wireless device, cellular node, or location. Additional domestic and international frequencies can also be included to offer increased functionality. Selected models of the signal booster 120 can be configured to operate with selected frequency bands based on the location of use. In another example, the signal booster 120 can automatically sense from the wireless device 110 or base station 130 (or GPS, etc.) which frequencies are used, which can be a benefit for international travelers.

In one example, the integrated device antenna 124 and the integrated node antenna 126 can be comprised of a single antenna, an antenna array, or have a telescoping form-factor. In another example, the integrated device antenna 124 and the integrated node antenna 126 can be a microchip antenna. An example of a microchip antenna is AMMAL001. In yet another example, the integrated device antenna 124 and the integrated node antenna 126 can be a printed circuit board (PCB) antenna. An example of a PCB antenna is TE 2118310-1.

In one example, the integrated device antenna 124 can receive uplink (UL) signals from the wireless device 110 and transmit DL signals to the wireless device 110 using a single antenna. Alternatively, the integrated device antenna 124 can receive UL signals from the wireless device 110 using a dedicated UL antenna, and the integrated device antenna 124 can transmit DL signals to the wireless device 110 using a dedicated DL antenna.

In one example, the integrated device antenna 124 can communicate with the wireless device 110 using near field communication. Alternatively, the integrated device antenna 124 can communicate with the wireless device 110 using far field communication.

In one example, the integrated node antenna 126 can receive downlink (DL) signals from the base station 130 and transmit uplink (UL) signals to the base station 130 via a single antenna. Alternatively, the integrated node antenna 126 can receive DL signals from the base station 130 using a dedicated DL antenna, and the integrated node antenna 126 can transmit UL signals to the base station 130 using a dedicated UL antenna.

In one configuration, multiple signal boosters can be used to amplify UL and DL signals. For example, a first signal booster can be used to amplify UL signals and a second signal booster can be used to amplify DL signals. In addition, different signal boosters can be used to amplify different frequency ranges.

In one configuration, the signal booster 120 can be configured to identify when the wireless device 110 receives a relatively strong downlink signal. An example of a strong downlink signal can be a downlink signal with a signal strength greater than approximately −80 dBm. The signal booster 120 can be configured to automatically turn off selected features, such as amplification, to conserve battery life. When the signal booster 120 senses that the wireless device 110 is receiving a relatively weak downlink signal, the integrated booster can be configured to provide amplification of the downlink signal. An example of a weak downlink signal can be a downlink signal with a signal strength less than −80 dBm.

In one example, the signal booster 120 can also include one or more of: a waterproof casing, a shock absorbent casing, a flip-cover, a wallet, or extra memory storage for the wireless device. In one example, extra memory storage can be achieved with a direct connection between the signal booster 120 and the wireless device 110. In another example, Near-Field Communications (NFC), Bluetooth v4.0, Bluetooth Low Energy, Bluetooth v4.1, Bluetooth v4.2, Bluetooth 5, Ultra High Frequency (UHF), 3GPP LTE, Institute of Electronics and Electrical Engineers (IEEE) 802.11a, IEEE 802.11b, IEEE 802.11g, IEEE 802.11n, IEEE 802.11ac, or IEEE 802.11ad can be used to couple the signal booster 120 with the wireless device 110 to enable data from the wireless device 110 to be communicated to and stored in the extra memory storage that is integrated in the signal booster 120. Alternatively, a connector can be used to connect the wireless device 110 to the extra memory storage.

In one example, the signal booster 120 can include photovoltaic cells or solar panels as a technique of charging the integrated battery and/or a battery of the wireless device 110. In another example, the signal booster 120 can be configured to communicate directly with other wireless devices with signal boosters. In one example, the integrated node antenna 126 can communicate over Very High Frequency (VHF) communications directly with integrated node antennas of other signal boosters. The signal booster 120 can be configured to communicate with the wireless device 110 through a direct connection, Near-Field Communications (NFC), Bluetooth v4.0, Bluetooth Low Energy, Bluetooth v4.1, Bluetooth v4.2, Ultra High Frequency (UHF), 3GPP LTE, Institute of Electronics and Electrical Engineers (IEEE) 802.11a, IEEE 802.11b, IEEE 802.11g, IEEE 802.11n, IEEE 802.11ac, IEEE 802.11ad, a TV White Space Band (TVWS), or any other industrial, scientific and medical (ISM) radio band. Examples of such ISM bands include 2.4 GHz, 3.6 GHz, 4.9 GHz, 5 GHz, or 5.9 GHz. This configuration can allow data to pass at high rates between multiple wireless devices with signal boosters. This configuration can also allow users to send text messages, initiate phone calls, and engage in video communications between wireless devices with signal boosters. In one example, the integrated node antenna 126 can be configured to couple to the wireless device 110. In other words, communications between the integrated node antenna 126 and the wireless device 110 can bypass the integrated booster.

In another example, a separate VHF node antenna can be configured to communicate over VHF communications directly with separate VHF node antennas of other signal boosters. This configuration can allow the integrated node antenna 126 to be used for simultaneous cellular communications. The separate VHF node antenna can be configured to communicate with the wireless device 110 through a direct connection, Near-Field Communications (NFC), Bluetooth v4.0, Bluetooth Low Energy, Bluetooth v4.1, Bluetooth v4.2, Ultra High Frequency (UHF), 3GPP LTE, Institute of Electronics and Electrical Engineers (IEEE) 802.11a, IEEE 802.11b, IEEE 802.11g, IEEE 802.11n, IEEE 802.11ac, IEEE 802.11ad, a TV White Space Band (TVWS), or any other industrial, scientific and medical (ISM) radio band.

In one configuration, the signal booster 120 can be configured for satellite communication. In one example, the integrated node antenna 126 can be configured to act as a satellite communication antenna. In another example, a separate node antenna can be used for satellite communications. The signal booster 120 can extend the range of coverage of the wireless device 110 configured for satellite communication. The integrated node antenna 126 can receive downlink signals from satellite communications for the wireless device 110. The signal booster 120 can filter and amplify the downlink signals from the satellite communication. In another example, during satellite communications, the wireless device 110 can be configured to couple to the signal booster 120 via a direct connection or an ISM radio band. Examples of such ISM bands include 2.4 GHz, 3.6 GHz, 4.9 GHz, 5 GHz, or 5.9 GHz.

In one configuration, repeaters (or signal boosters) can operate on cellular frequencies in order to amplify cellular signals. In the past, separate repeaters could be used to operate on public safety frequencies in order to amplify public safety signals. The public safety frequencies can be used to service mission-critical communications for first responders, as well as public safety-related telecommunications for state and local governments. The public safety frequencies can be used by walkie-talkies, as well as other devices that are configured to operate on public safety frequencies.

In the past, public safety repeaters were not compatible with cellular repeaters in a shared area (e.g., in a same building) because downlink and uplink cellular frequencies can be spectrally adjacent to downlink and uplink public safety frequencies, which would cause feedback oscillations. In other words, tight banding between the cellular frequencies and the public safety frequencies would cause the feedback oscillations. In previous designs, filters would be unable to roll off fast enough in order to allow both a public safety repeater and a cellular repeater to coexist in the shared area. Thus, with previous solutions, a standard cellular repeater and a standard public safety repeater that were installed in a same location would be incompatible with each other due to the feedback oscillations. In other words, with previous solutions, the standard cellular repeater and the standard public safety repeater would be unable to work together or coexist in the shared area. As a result, in the past, buildings would use a public safety repeater or a cellular repeater, but a building owner that attempted to install the other type of repeater (i.e., attempted to use both a cellular repeater and a public safety repeater in the same building) would experience noise and feedback problems.

In the present technology, a cellular and public safety repeater is described. The cellular and public safety repeater can be a combined unit that can operate on both the public safety and cellular frequencies at the same time, without experiencing the noise and feedback problems that were prevalent in the previous solutions. In the cellular and public safety repeater, a passband can be expanded, such that adjacent common-direction bands (regardless of whether the common-direction bands are for public safety or for cellular) can be combined together. For example, multiple adjacent uplink bands can be combined together and/or multiple adjacent downlink bands can be combined together.

Alternatively, a separate public safety repeater and a cellular repeater are described. In this case, the public safety repeater and the cellular repeater can be two separate products, but these products can be compatible with each other. In this example, the public safety repeater and the cellular repeater can each have sharp filtering at the edges of bands, which can prevent feedback oscillations when the public safety repeater and the cellular repeater are installed in the shared area. As a result, the public safety repeater and the cellular repeater can be compatible with each other when both operating in the shared area (e.g., in a same building).

In one example, the cellular and public safety repeater, as well as the separate public safety repeater and cellular repeater, can implement a sharp roll-off in certain areas, such as between adjacent downlink and uplink bands. For example, the repeater(s) can down convert to an intermediate frequency (IF) in order to achieve sharp filtering. While this process can result in a small amount of the passband being lost, this solution enables compatibility between cellular frequencies that are spectrally adjacent to public safety frequencies when coexisting in the shared area. The repeater(s) can employ full-band IF filtering. In other words, the repeater(s) can take a full band and do not channelize. Thus, for IF, the signal can be down converted, and sharper filtering can be obtainable at the lower frequencies.

In one example, the repeater(s) can use a mixture of IF filtering and standard radio frequency (RF) filtering, depending on a gap between frequencies. For example, for uplink and downlink frequencies that are spectrally adjacent, the repeater(s) can use IF filtering. However, for uplink and downlink frequencies that are not spectrally adjacent, the repeater(s) can use standard RF filtering.

In another example, the repeater(s) can employ digital filtering to achieve the sharp filtering. With digital filtering, the repeater(s) can use an analog-to-digital converter (ADC), a field programmable gate array (FPGA) and then a digital-to-analog converter (DAC). With digital filtering, the ADC can operate in RF frequencies, or a signal can be down converted to IF and then possibly down converted to baseband in order to get a reduced sampling rate, which can reduce a computational load on the FPGA. The FPGA can use digital signal processing (DSP) or other digital filtering techniques to pass multiple bands.

In the past, a standard repeater would have one antenna on a front-end of the repeater. However, when an uplink frequency is spectrally adjacent to a downlink frequency, the filtering employed by the standard repeater would not be effective. For example, an uplink signal that was transmitted by the standard repeater would be picked up by an antenna of the standard repeater, and that uplink signal would be directed to a downlink signal path of the standard repeater. Similarly, a downlink signal that was transmitted by the standard repeater would be picked up by the antenna, and that downlink signal would be directed to an uplink path of the standard repeater. In the past, a downlink/uplink signal that is adjacent would go back through a multiplexer of the standard repeater because the filtering would not be sharp and saturate a low noise amplifier (LNA) in the standard repeater. As a result, the downlink/uplink signal would be fed back into an opposite signal path of the standard repeater, and the downlink/uplink signal would degrade the LNA and raise a noise floor.

In the present technology, the cellular and public safety repeater can use two outside antennas (or donor antennas) and two inside antennas (or server antennas). The cellular and public safety repeater can employ separate antennas on each side to allow opposite-direction adjacent frequencies to be amplified. For example, signals that come into the cellular and public safety repeater can be amplified and can be down converted to IF to achieve sharp filtering (or can be filtered using digital filtering), and with the sufficient isolation between the antennas, even if transmitted signals are fed back into the opposite-direction signal path (i.e., the signals are picked back up by the wideband antenna), these signals can have a low enough signal power that the signals are amplified by the LNA but then filtered out by the IF filtering (or digital filtering) on the opposite-direction signal path. Thus, the combination of the separate antennas and the IF filtering (or digital filtering) can serve to reduce or eliminate a likelihood of feedback oscillations due to uplink/downlink signals that are in spectrally adjacent bands.

In a more specific example, with the cellular and public safety repeater, a 896 MHz uplink public safety signal can be transmitted out (e.g., using a transmit antenna), and some of the 896 MHz uplink public safety signal can be picked up by another antenna (e.g., a receive antenna). The antennas can be separated to achieve sufficient isolation, such that the 896 MHz uplink public safety signal does not saturate a front-end of the cellular and public safety repeater. The 896 MHz uplink public safety signal can be picked up by the receive antenna because the 896 MHz uplink public safety signal is not filtered by the receive antenna or by a multiplexer (or duplexer) in the cellular and public safety repeater. The 896 MHz uplink public safety signal can be amplified in a downlink signal path by the LNA, but with sufficient isolation between the antennas, this high-powered 896 MHz signal can be low enough power that the LNA does not saturate and the 896 MHz signal can be filtered out through IF filtering (or digital filtering) in the downlink signal path. Due to the adjacent uplink and downlink cellular frequencies and public safety frequencies, sufficient isolation cannot be achieved through standard filtering. Thus, the antennas of the cellular and public safety repeater can be separated to achieve sufficient spatial isolation, thereby enabling signals in adjacent uplink and downlink cellular frequencies and public safety frequencies to be amplified at the same time by the cellular and public safety repeater.

In one example, spectrally adjacent uplink/downlink bands do not have a guard band. To mitigate this problem, antenna isolation can be employed and then sharp IF filtering (or digital filtering) can be implemented to enable signals in adjacent uplink and downlink cellular frequencies and public safety frequencies to be amplified at the same time by the cellular and public safety repeater.

In the past, the standard repeater would include a bidirectional antenna and a multiplexer on a front end, which would isolate the uplink from the downlink. However, when the uplink and downlink bands are spectrally adjacent, the multiplexers cannot provide sufficient isolation. Therefore, with the current design, the antennas can be separated (i.e., separate transmit/receive antennas can be used) in order to sufficiently isolate the uplink from the downlink.

In one example, with enough isolation between the antennas, the cellular and public safety repeater may not employ IF filtering, but can rather use standard RF amplification and filtering. For example, when an increased level of isolation is achieved between the antennas (e.g., 80 dB), then the isolation between the antennas can be greater than a gain in the passband, so feedback can be at a low level and not affect the cellular and public safety repeater. In one example, the increased level of isolation between the antennas (e.g., 80 dB) can be achieved using high gain antennas or additional spatial separation.

In one example, the outside antennas (or donor antennas) can be in a single package, but can have sufficient isolation due to polarization and/or by design. Similarly, the inside antennas (or server antennas) can be in a single package, but can have sufficient isolation due to polarization and/or by design.

In one configuration, the cellular and public safety repeater can employ separate uplink and downlink antennas (e.g., separate uplink and downlink server and donor antennas), which can provide approximately 40 decibels (dB) of isolation between the uplink and the downlink. The 40 dB of isolation can be achieved by physically separating the antennas, or by making the antennas directional. The 40 dB of isolation can keep the uplink from getting into the downlink and saturating the signal path. Alternatively, the cellular and public safety repeater can employ a circulator on a front-end, which can be communicatively coupled to a single antenna (e.g., a transmit/receive antenna or bidirectional antenna). With the circulator, a signal can come out of the circulator and theoretically transmit out of the antenna. The circulator can serve to provide isolation between the uplink and the downlink. For example, the circulator can provide approximately 20 dB of isolation between the uplink and downlink. In some cases, poor return loss can degrade the 20 dB of isolation. In another example, the cellular and public safety repeater can employ a circulator on each end depending on power requirements for the cellular and public safety repeater. For example, when there is a lower power on a downlink path and less isolation is needed, that side can employ a circulator, while the other side can employ separate antennas. In another example, an isolator and circulator can be used for each signal path to increase isolation, and redundant elements/paths can be added to switch in for reliability.

In one configuration, a novel repeater can employ separate antennas (or antenna isolation) and/or sharp IF filtering (or digital filtering) to bi-directionally amplify signals in spectrally adjacent, opposite-direction bands. In other words, the novel repeater can be used to address adjacent frequency situations where the uplink band(s) and the downlink band(s) are spectrally adjacent. In one example, the spectrally adjacent, opposite-direction bands can correspond to cellular bands and public safety bands, but this concept is applicable to other types of bands as well.

In one example, the cellular and public safety repeater can include separate, filtered signal paths for public safety bands versus cellular bands, even when the public safety bands and cellular bands are spectrally adjacent and IF/digital filtering is used to separate them.

In one configuration, the cellular and public safety repeater can include a controller to adjust automatic gain control (AGC) levels for the public safety bands and the cellular bands. The controller can adjust the AGC levels for the public safety bands separate from the cellular bands. Public safety transmissions are generally at full power, which is not the case for cellular transmissions. For example, a walkie-talkie can transmit out at full power, whereas a cellular phone can transmit at a minimum power required and can have a wide dynamic range (e.g., 70 dB or more of dynamic range). If one full band was used in the cellular and public safety repeater and one of the walkie-talkies transmitted, this would take an increased amount of power for the passband. Therefore, sub-bands or channels can be created when at intermediate frequencies (Ifs) for public safety frequency ranges and cellular frequency ranges, and the AGC can be performed separately.

In one example, the controller in the cellular and public safety repeater can apply network protections for the cellular bands, but may not apply network protections for the public safety bands. For example, FCC rules require network protection for cellular bands, but not for public safety bands.

In one example, the controller in the cellular and public safety repeater can perform network protection in order to protect a cellular network from overload or noise floor increase. The controller can perform network protection by adjusting a gain or noise power for each band in the uplink transmission paths based on data from each band in the downlink transmission paths. The data from each band in the downlink transmission paths can include a booster station coupling loss (BSCL) or a received signal strength indication (RSSI). The controller can perform network protection in accordance with the Federal Communications Commission (FCC) Consumer Booster Rules, which necessitate that uplink signal paths and downlink signal paths are to work together for network protection.

More specifically, in order to perform network protection, the controller can identify a booster station coupling loss (BSCL) for each band in a selected number of downlink transmission paths. The controller can identify one or more downlink transmission paths that correspond to a minimum BSCL for each band as compared to other downlink transmission paths in the cellular and public safety repeater. The controller can adjust (e.g., increase or decrease) an uplink gain or noise power for each band in the selected number of uplink transmission paths based on the minimum BSCL for each band. When noise protection is performed at the cellular and public safety repeater, each band can be adjusted separately. As a result, the cellular and public safety repeater can protect a base station in the cellular network from becoming overloaded with uplink signals from the cellular and public safety repeater that exceed a defined power threshold.

In another example, in order to perform network protection, the controller can identify a received signal strength indication (RSSI) for each band in the selected number of downlink transmission paths. The controller can identify one or more downlink transmission paths that correspond to a maximum RSSI as compared to other downlink transmission paths in the cellular and public safety repeater. The controller can adjust (e.g., increase or decrease) an uplink gain or noise power for each band in the selected number of uplink transmission paths based on the maximum RSSI for each band. As a result, the cellular and public safety repeater can protect a base station in the cellular network from becoming overloaded with uplink signals from the cellular and public safety repeater that exceed a defined power threshold.

Figure 2:
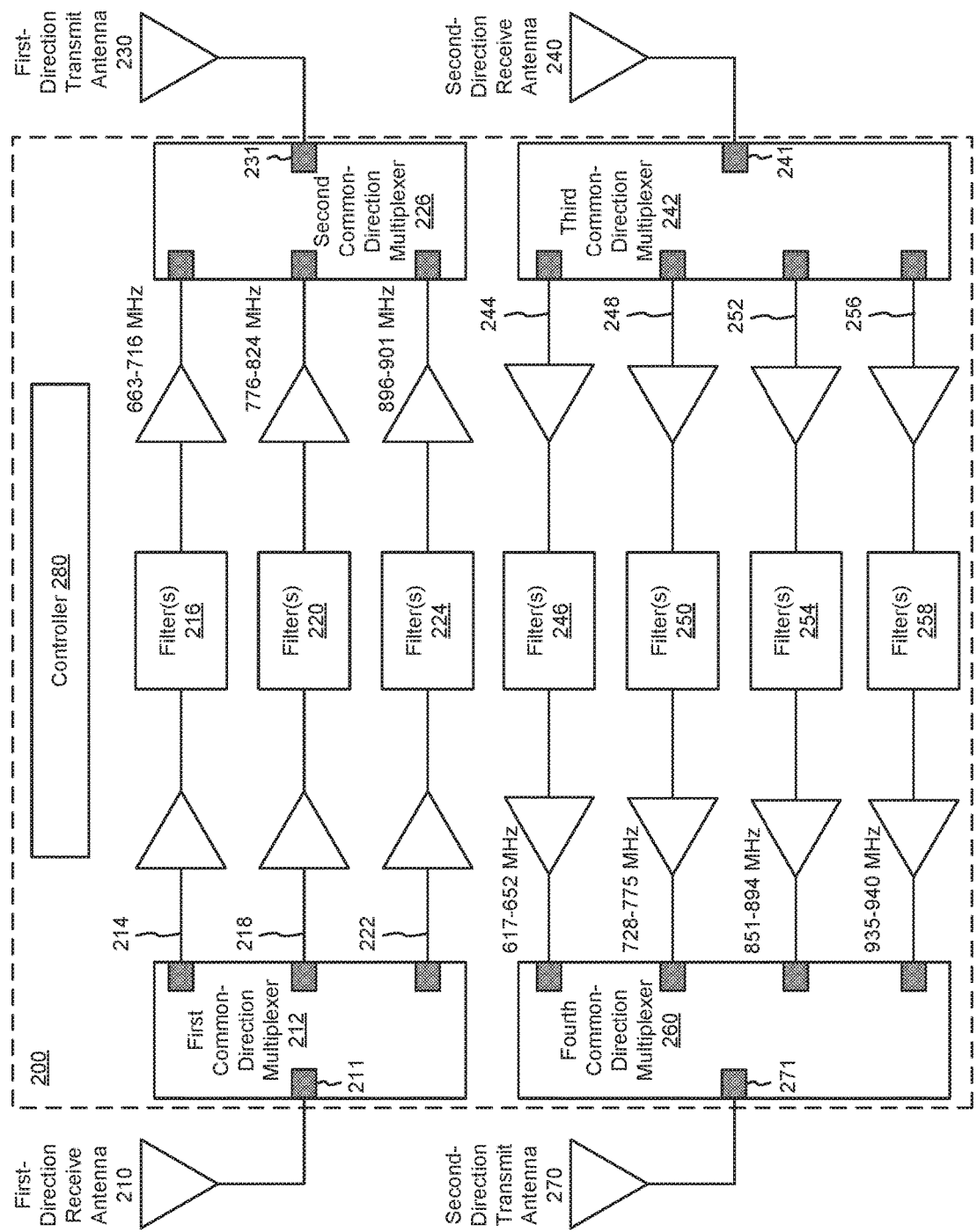
FIG. 2 illustrates a wideband cellular and public safety repeater in accordance with an example.

FIG. 2 illustrates an example of a wideband cellular and public safety repeater 200. The wideband cellular and public safety repeater 200 can amplify and filter signals in one or more public safety frequency ranges (or public safety bands or channels), as well as amplify and filter signals in one or more cellular frequency ranges (or cellular bands or channels). In other words, the wideband cellular and public safety repeater 200 can be a single unit that combines cellular signal amplification and filtering capabilities along with public safety signal amplification and filtering capabilities. The wideband cellular and public safety repeater 200 can amplify and filter signals in uplink cellular frequency ranges and spectrally adjacent downlink public safety frequency ranges, as well as downlink cellular frequency ranges and spectrally uplink public safety frequency ranges at a same time (i.e., spectrally adjacent, opposite-direction frequency ranges).

In one example, the public safety frequency ranges include: 788-805 megahertz (MHz), 806-824 MHz, or 896-901 MHz that correspond to uplink public safety frequency ranges, or 758-775 MHz, 851-869, or 935-940 MHz that corresponds to downlink public safety frequency ranges. In another example, the cellular frequency ranges include: 663-716 MHz, 698-716 MHz, 776-787 MHz, or 824-849 MHz that corresponds to uplink cellular frequency ranges, or 617-652 MHz, 728-757 MHz, or 869-894 MHz that correspond to downlink cellular frequency ranges.

In one example, uplink public safety frequency ranges can be spectrally adjacent to downlink cellular frequency ranges, and downlink public safety frequency ranges can be spectrally adjacent to uplink cellular frequency ranges. For example, the downlink public safety frequency range of 758-775 MHz is spectrally adjacent to the uplink cellular frequency range of 776-787 MHz. In another example, the uplink cellular frequency range of 824-775 849 is spectrally adjacent to the downlink public safety frequency range of 851-869 MHz. In yet another example, the downlink cellular frequency range of 869-775 894 is spectrally adjacent to the uplink public safety frequency range of 896-901 MHz.

As used herein, two frequency ranges (or two bands or two channels) can be "spectrally adjacent" when the two frequency ranges are abutting (i.e., 0 MHz between the two frequency ranges), or two frequency ranges can be spectrally adjacent when there is a relatively small amount of separation between the two frequency ranges, such as 1 MHz or 2 MHz. In one example, "spectrally adjacent" can be defined functionally based on a filter roll-off capability. When frequency ranges are so close together that a bandpass filter would be unable to roll off (or attenuate) the other frequency range more than, for example, 10 dB, the frequency ranges can be considered spectrally adjacent. By this definition, 1-5 MHz between frequency ranges can reasonably allow two frequency ranges to be considered spectrally adjacent. In some cases, the separation between spectrally adjacent frequency ranges can be up to 9 MHz or more depending on a frequency and a Q factor of the bandpass filter. As a result, "spectrally adjacent" separation can be different depending on which bandpass filter technology is being used. For example, a lower Q technology might consider two frequency ranges spectrally adjacent where a higher Q technology would be able to filter the frequency ranges separately.

In one configuration, the wideband cellular and public safety repeater 200 can include a first common-direction multiplexer 212 (or duplexer), a second common-direction multiplexer 226 (or duplexer), a third common-direction multiplexer 242 (or duplexer), and a fourth common-direction multiplexer 260 (or duplexer). The first common-direction multiplexer 212 can be coupled to a first antenna port 211, and the first antenna port 211 can be communicatively coupled to a first-direction receive antenna 210. The second common-direction multiplexer 226 can be coupled to a second antenna port 231, and the second antenna port 231 can be communicatively coupled to a first-direction transmit antenna 230. The third common-direction multiplexer 242 can be coupled to a third antenna port 241, and the third antenna port 241 can be communicatively coupled to a second-direction receive antenna 240. The fourth common-direction multiplexer 260 can be coupled to a fourth antenna port 271, and the fourth antenna port 271 can be communicatively coupled to a second-direction transmit antenna 270. The common-direction multiplexers 212, 226, 242, 260 can be useful for minimizing the number of antennas in the wideband cellular and public safety repeater 200.

In one example, the first-direction receive antenna 210 and the second-direction transmit antenna 270 can be isolated using spatial isolation, polarization and/or antenna design. Similarly, the first-direction transmit antenna 230 and the second-direction receive antenna 240 can be isolated using spatial isolation, polarization and/or antenna design. Due to the isolation, the wideband cellular and public safety repeater 200 can amplify and filter signals in uplink cellular frequency ranges and spectrally adjacent downlink public safety frequency ranges, as well as downlink cellular frequency ranges and spectrally uplink public safety frequency ranges at a same time (i.e., spectrally adjacent, opposite-direction frequency ranges).

In one example, the first-direction receive antenna 210 and the second-direction transmit antenna 270 can be included in a first antenna package, and the first-direction transmit antenna 230 and the second-direction receive antenna 240 can be included in a second antenna package.

In one configuration, the wideband cellular and public safety repeater 200 can include: a first first-direction amplification and filtering signal path 214 communicatively coupled between the first common-direction multiplexer 212 and the second common-direction multiplexer 226, a second first-direction amplification and filtering signal path 218 communicatively coupled between the first common-direction multiplexer 212 and the second common-direction multiplexer 226, and a third first-direction amplification and filtering signal path 222 communicatively coupled between the first common-direction multiplexer 212 and the second common-direction multiplexer 226.

In one example, the first first-direction amplification and filtering signal path 214 can be a first uplink amplification and filtering signal path that corresponds to an uplink cellular frequency range of 663-716 MHz, the second first-direction amplification and filtering signal path 218 can be a second uplink amplification and filtering signal path that corresponds to an uplink frequency range of 776-824 MHz (i.e., includes an uplink cellular frequency range of 776-787 MHz and an uplink public safety frequency range of 788-805 MHz and 806-824 MHz), and the third first-direction amplification and filtering signal path 222 can be a third uplink amplification and filtering signal path that corresponds to an uplink public safety frequency range of 896-901 MHz In one configuration, the wideband cellular and public safety repeater 200 can include: a first second-direction amplification and filtering signal path 244 communicatively coupled between the third common-direction multiplexer 242 and the fourth common-direction multiplexer 260, a second second-direction amplification and filtering signal path 248 communicatively coupled between the third common-direction multiplexer 242 and the fourth common-direction multiplexer 260, a third second-direction amplification and filtering signal path 252 communicatively coupled between the third common-direction multiplexer 242 and the fourth common-direction multiplexer 260, and a fourth second-direction amplification and filtering signal path 256 communicatively coupled between the third common-direction multiplexer 242 and the fourth common-direction multiplexer 260.

In one example, the first second-direction amplification and filtering signal path 244 can be a first downlink amplification and filtering signal path that corresponds to a downlink cellular frequency range of 617-652 MHz, the second second-direction amplification and filtering signal path 248 can be a second downlink amplification and filtering signal path that corresponds to a downlink frequency range of 728-775 MHz (i.e., includes a downlink cellular frequency range of 728-757 MHz and a downlink public safety frequency range of 758-775 MHz), the third second-direction amplification and filtering signal path 252 can be a third downlink amplification and filtering signal path that corresponds to a downlink public safety frequency range of 851-894 MHz (i.e., includes a downlink public safety frequency range of 851-869 MHz and a downlink cellular frequency range of 869-894 MHz), and the fourth second-direction amplification and filtering signal path 256 can be a fourth downlink amplification and filtering signal path that corresponds to a downlink public safety frequency range of 935-940 MHz.

In one configuration, the wideband cellular and public safety repeater 200 can separate the first-direction frequency ranges from the second-direction frequency ranges. Spectrally adjacent first-direction frequency ranges can be combined on a single first-direction amplification and filtering signal path. The first-direction amplification and filtering signal paths 214, 218, 220 can be communicatively coupled to the first common-direction multiplexer 212 and the second common-direction multiplexer 226. Similarly, spectrally adjacent second-direction frequency ranges can be combined on a single second-direction amplification and filtering signal path. The second-direction amplification and filtering signal paths 244, 248, 252, 256 can be communicatively coupled to the third common-direction multiplexer 242 and the fourth common-direction multiplexer 260.

In one example, the first-direction amplification and filtering signal paths 214, 218, 222 and the second-direction amplification and filtering signal paths 244, 248, 252, 256 can each include a low noise amplifier (LNA) and/or a power amplifier (PA).

In one configuration, the first first-direction amplification and filtering signal path 214, the second first-direction amplification and filtering signal path 218, and the third first-direction amplification and filtering signal path 222 can each include one or more filter(s) 216, 220, 224, respectively, to filter a first-direction signal (e.g., an uplink signal) that is being directed along the respective first-direction signal paths. For example, the filter(s) 216, 220, 224 can include intermediate frequency (IF) bandpass filter(s), full-band IF filter(s), radio frequency (RF) bandpass filter(s) and/or digital filter(s). Similarly, the first second-direction amplification and filtering signal path 244, the second second-direction amplification and filtering signal path 248, the third second-direction amplification and filtering signal path 252, and the fourth second-direction amplification and filtering signal path 256 can each include one or more filter(s) 246, 250, 254, 258, respectively, to filter a second-direction signal (e.g., a downlink signal) that is being directed along the respective second-direction signal paths. For example, the filter(s) 246, 250, 254, 258 can include (IF bandpass filter(s), full-band IF filter(s), RF bandpass filter(s) and/or digital filter(s). The filter(s) 216, 220, 224, 246, 250, 254, 258 can be used to achieve sharp filtering, which can enable compatibility between spectrally adjacent, opposite-direction frequency ranges (e.g., spectrally adjacent, opposite-direction cellular frequency ranges and public safety frequency ranges).

As an example, one of the first-direction amplification and filtering signal paths 244, 248, 252, 256 can amplify and filter a signal in a first-direction frequency range, and one of the second-direction amplification and filtering signal paths 214, 218, 222 can amplify and filter a signal in a second-direction frequency range, where the first-direction frequency range is spectrally adjacent to the second-direction frequency range. As previously described, the filter(s) 216, 220, 224, 246, 250, 254, 258 can be used to achieve sharp filtering, which can enable compatibility between spectrally adjacent, opposite-direction frequency ranges. The sharp filtering can cause the filter(s) 216, 220, 224, 246, 250, 254, 258 to filter out opposite-direction spectrally adjacent frequency ranges. For example, the filter(s) 216, 220, 224 can pass through uplink signals (both public safety and cellular uplink signals), but filter out downlink signals (both public safety and cellular downlink signals). On the other hand, the filter(s) 246, 250, 254, 258 can pass through downlink signals (both public safety and cellular downlink signals), but filter out uplink signals (both public safety and cellular uplink signals).

As a non-limiting example, a 775 MHz downlink public safety signal can be directed on the second second-direction amplification and filtering signal path 248 to the fourth common-direction multiplexer 260. The 775 MHz downlink public safety signal can be transmitted from the second-direction transmit antenna 270. However, some of the 775 MHz downlink public safety signal can be picked up by the first-direction receive antenna 210. The second-direction transmit antenna 270 and the first-direction receive antenna 210 can be separated to achieve sufficient isolation, such that the 775 MHz downlink public safety signal does not saturate a front-end of the wideband cellular and public safety repeater 200. The 775 MHz downlink public safety signal can be picked up by the first-direction receive antenna 210 because the 775 MHz downlink public safety signal is not filtered by the first-direction receive antenna 210 or by the first common-direction multiplexer 212. The 775 MHz downlink public safety signal can be directed to the second first-direction amplification and filtering signal path 218, and the 775 MHz downlink public safety signal can be amplified by an LNA in the second first-direction amplification and filtering signal path 218. However, due to the sufficient isolation between the second-direction transmit antenna 270 and the first-direction receive antenna 210, the high-powered 775 MHz downlink public safety signal can be low enough power that the LNA does not saturate and the 775 MHz downlink public safety signal can be filtered out through the filter(s) 220 (e.g., IF filter(s), full-band IF filter(s), RF bandpass filter(s) and/or digital filter(s)) on the second first-direction amplification and filtering signal path 218.

In one configuration, the wideband cellular and public safety repeater 200 can receive a first-direction signal (e.g., an uplink signal) from a mobile device via the first-direction receive antenna 210. The first-direction signal can be received at the first common-direction multiplexer 212, and depending on a frequency of the first-direction signal, the first-direction signal can be directed to one of the first-direction amplification and filtering signal paths 214, 218, 222. The first-direction signal can be provided to the second common-direction multiplexer 236, and then the first-direction signal can be transmitted to a base station via the first-direction transmit antenna 230. In another example, the wideband cellular and public safety repeater 200 can receive a second-direction signal (e.g., a downlink signal) from the base station via the second-direction receive antenna 240. The second-direction signal can be received at the third common-direction multiplexer 242, and depending on a frequency of the second-direction signal, the second-direction signal can be directed to one of the second-direction amplification and filtering signal paths 244, 248, 252, 256. The second-direction signal can be provided to the fourth common-direction multiplexer 260, and then the second-direction signal can be transmitted to the mobile device via the second-direction transmit antenna 270.

In one configuration, the wideband cellular and public safety repeater 200 can include a controller 280 operable to adjust automatic gain control (AGC) levels for the public safety frequency ranges and the cellular frequency ranges. For example, the controller 280 can adjust the AGC levels for the public safety frequency ranges separate from the cellular frequency ranges. In other words, the controller 280 can select AGC levels for the public safety frequency ranges that are separate from AGC levels that are selected for the cellular frequency ranges. The AGC for public safety are not in the same sub-bands as for cellular. The controller 280 can split frequencies and filter differently at IF to create sub-bands and AGC those sub-bands separately. In one example, the controller 280 can select AGC levels for the cellular frequency ranges for network protection, but may not apply network protections for the public safety frequency ranges, as the FCC requires network protection for cellular frequency ranges but not for public safety frequency ranges.

In one example, for bands with sufficient spacing (e.g., 775-851 MHz), diplexers can be developed to simplify the common-direction multiplexers 212, 226, 242, 260 in the cellular and public safety repeater 200. Therefore, the first second-direction amplification and filtering signal path 244 and the second second-direction amplification and filtering signal path 248 corresponding to 617-775 MHz can be coupled to diplexers (instead of multiplexers). In addition, the third second-direction amplification and filtering signal path 252 and the fourth second-direction amplification and filtering signal path 256 corresponding to 851-940 MHz can be coupled to diplexers (instead of multiplexers).

Figure 3:
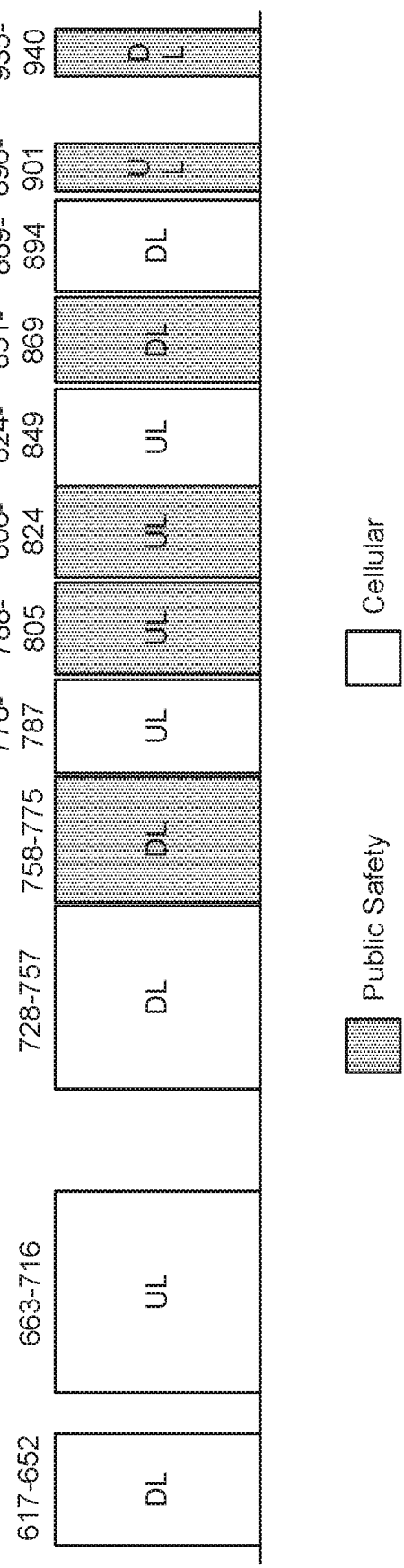
FIG. 3 illustrates a plurality of cellular frequency ranges and public safety frequency ranges in an uplink and in a downlink in accordance with an example.

FIG. 3 illustrates an example of a plurality of cellular frequency ranges and public safety frequency ranges in an uplink and in a downlink. In some cases, uplink cellular frequency ranges can be spectrally adjacent with downlink public safety frequency ranges, or downlink cellular frequency ranges can be spectrally adjacent with uplink public safety frequency ranges.

In one example, the public safety frequency ranges include: 788-805 megahertz (MHz), 806-824 MHz, or 896-901 MHz that correspond to uplink public safety frequency ranges, or 758-775 MHz, 851-869, or 935-940 MHz that corresponds to downlink public safety frequency ranges. In another example, the cellular frequency ranges include: 663-716 MHz, 698-716 MHz, 776-787 MHz, or 824-849 MHz that corresponds to uplink cellular frequency ranges, or 617-652 MHz, 728-757 MHz, or 869-894 MHz that correspond to downlink cellular frequency ranges.

As previously discussed, the 758-775 MHz downlink public safety frequency range and the spectrally adjacent 776-787 MHz uplink cellular frequency range can cause problems due to the tight banding. Similarly, the 824-849 MHz uplink cellular frequency range and the spectrally adjacent 851-869 MHz downlink public safety frequency range can cause problems due to the tight banding. Similarly, the 869-894 MHz downlink cellular frequency range and the spectrally adjacent 896-901 MHz uplink public safety frequency range can cause problems due to the tight banding. Therefore, sharp IF filtering (or digital filtering) and antenna isolation (by separating uplink/downlink donor antennas and server antennas) can be used to achieve amplification and filtering of spectrally adjacent, opposite-direction (i.e., uplink and downlink) signals.

Figure 4:
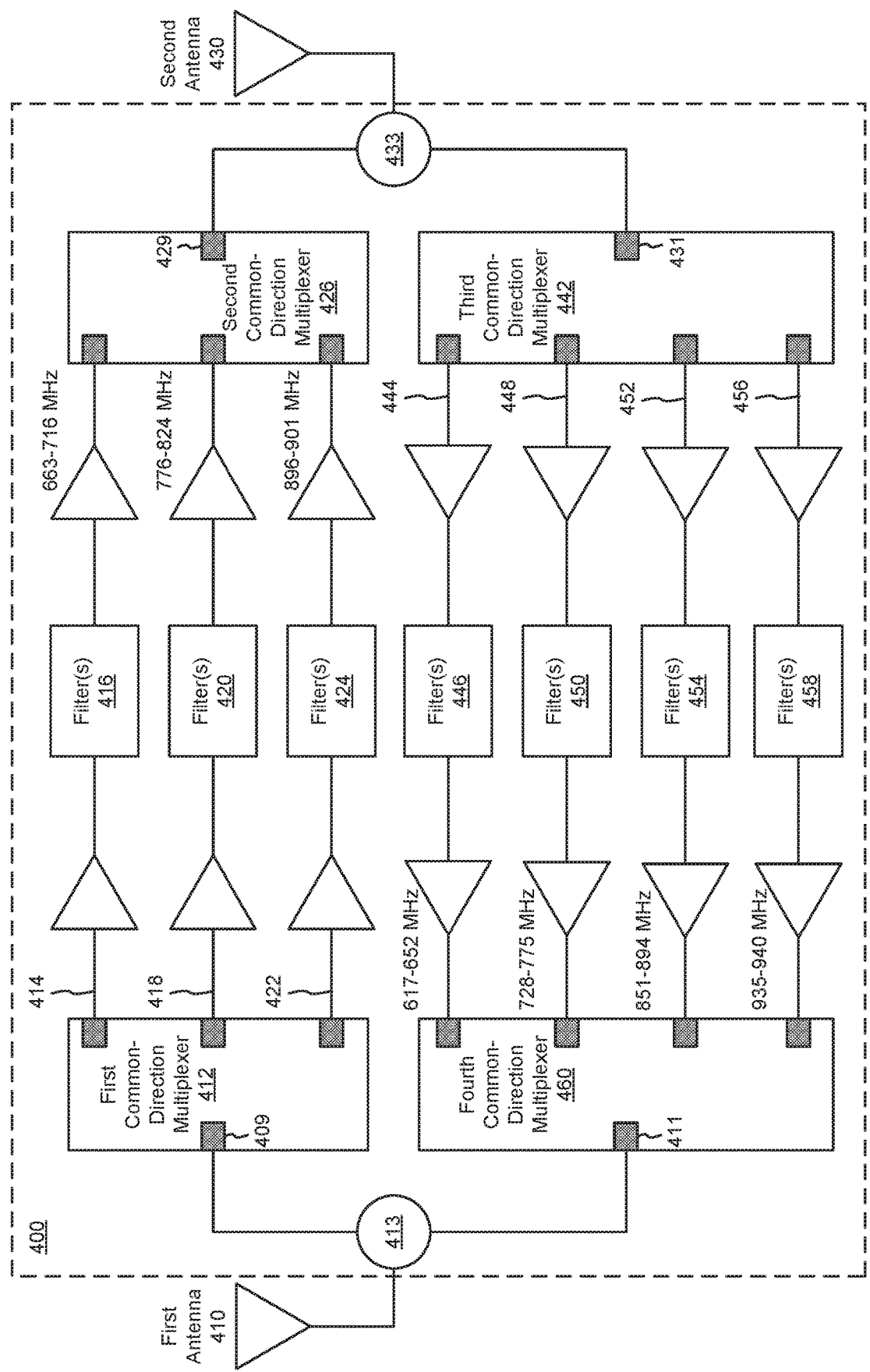
FIG. 4 illustrates a wideband cellular and public safety repeater that includes one or more circulators in accordance with an example.

FIG. 4 illustrates an example of a wideband cellular and public safety repeater 400 that includes one or more circulators 413, 433. The wideband cellular and public safety repeater 400 can amplify and filter signals in one or more public safety frequency ranges (or public safety bands or channels), as well as amplify and filter signals in one or more cellular frequency ranges (or cellular bands or channels). The wideband cellular and public safety repeater 400 can amplify and filter signals in uplink cellular frequency ranges and spectrally adjacent downlink public safety frequency ranges, as well as downlink cellular frequency ranges and spectrally uplink public safety frequency ranges at a same time (i.e., spectrally adjacent, opposite-direction frequency ranges).

In one example, the wideband cellular and public safety repeater 400 can include a first common-direction multiplexer 412, a second common-direction multiplexer 426, a third common-direction multiplexer 442, and a fourth common-direction multiplexer 460. The wideband cellular and public safety repeater 400 can include a first first-direction amplification and filtering signal path 414, a second first-direction amplification and filtering signal path 418, and a third first-direction amplification and filtering signal path 422 communicatively coupled between the first common-direction multiplexer 412 and the second common-direction multiplexer 426. In addition, the wideband cellular and public safety repeater 400 can include a first second-direction amplification and filtering signal path 444, a second second-direction amplification and filtering signal path 448, a third second-direction amplification and filtering signal path 452, and a fourth second-direction amplification and filtering signal path 456 communicatively coupled between the third common-direction multiplexer 442 and the fourth common-direction multiplexer 460.

In one example, the first-direction amplification and filtering signal paths 414, 418, 422 can each include one or more filter(s) 416, 420, 424, respectively. The second-direction amplification and filtering signal paths 444, 448, 452, 456 can each include one or more filter(s) 446, 450, 454, 458, respectively. The filter(s) 416, 420, 424, 446, 450, 454, 458 can be IF filter(s), full-band IF filter(s), RF bandpass filter(s) and/or digital filter(s).

In one configuration, the first common-direction multiplexer 412 can be coupled to a first antenna port 409, which can be communicatively coupled to a first circulator 413. The fourth common-direction multiplexer 460 can be coupled to a fourth antenna port 411, which can be also communicatively coupled to the first circulator 413. The first circulator 413 can be communicatively coupled to a first antenna 410. Similarly, the second common-direction multiplexer 426 can be coupled to a first second port 429, which can be communicatively coupled to a second circulator 433. The third common-direction multiplexer 442 can be coupled to a third antenna port 431, which can be also communicatively coupled to the second circulator 433. The second circulator 433 can be communicatively coupled to a second antenna 430.

In this configuration, the wideband cellular and public safety repeater 400 may not employ separate antennas for uplink and downlink. Rather, the wideband cellular and public safety repeater 400 can include a bi-directional first antenna 410 and a bi-directional second antenna 430, and the first antenna 410 can be coupled to the first common-direction multiplexer 412 and the fourth common-direction multiplexer 460 via the first circulator 413, and the second antenna 430 can be coupled to the second common-direction multiplexer 426 and the third common-direction multiplexer 442 via the second circulator 433.

Figure 5:
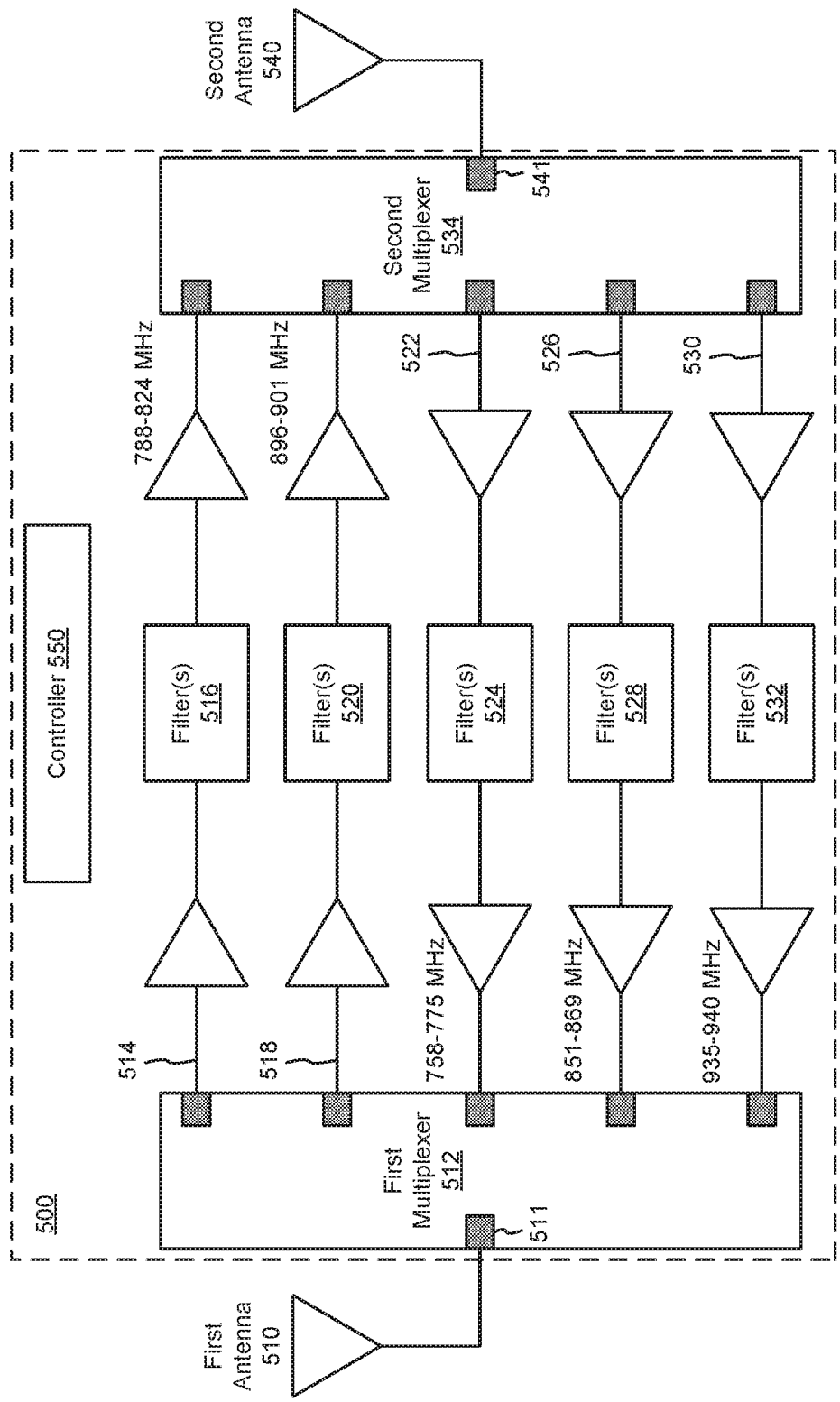
FIG. 5 illustrates a public safety repeater that is compatible with a wideband cellular repeater in a shared area in accordance with an example.

FIG. 5 illustrates an example of a public safety repeater 500. The public safety repeater 500 can be compatible with a wideband cellular repeater (not shown) in a shared area (e.g., in a same building). The public safety repeater 500 can employ sharp filtering (e.g., IF filtering, full-band IF filtering, RF filtering, or digital filtering) using filter(s) 516, 520, 524, 528, 532, such that signals in public safety frequency ranges that are amplified and filtered by the public safety repeater 500 do not cause feedback oscillations for the wideband cellular repeater in the shared area that amplifies and filters signals in cellular frequency ranges that are spectrally adjacent and opposite direction to the signals in the public safety frequency ranges. In addition, the public safety repeater 500 can have no filter overlap (or frequency range overlap) with the wideband cellular repeater.

In one configuration, the public safety repeater 500 can include a first multiplexer 512 and a second multiplexer 534. The first multiplexer 512 can be coupled to a first antenna port 511, which can be communicatively coupled to a first antenna 510. The second multiplexer 534 can be coupled to a second antenna port 541, which can be communicatively coupled to a second antenna 540. The public safety repeater 500 can include a first first-direction amplification and filtering signal path 514, a second first-direction amplification and filtering signal path 518, a first second-direction amplification and filtering signal path 522, a second second-direction amplification and filtering signal path 526, and a third second-direction amplification and filtering signal path 530, which are each communicatively coupled between the first multiplexer 512 and the second multiplexer 534. In addition, the public safety repeater 500 can include a controller 550 to adjust AGC levels for the first-direction amplification and filtering signal paths 514, 518 and the second-direction amplification and filtering signal paths 522, 526, 530.

Figure 6:
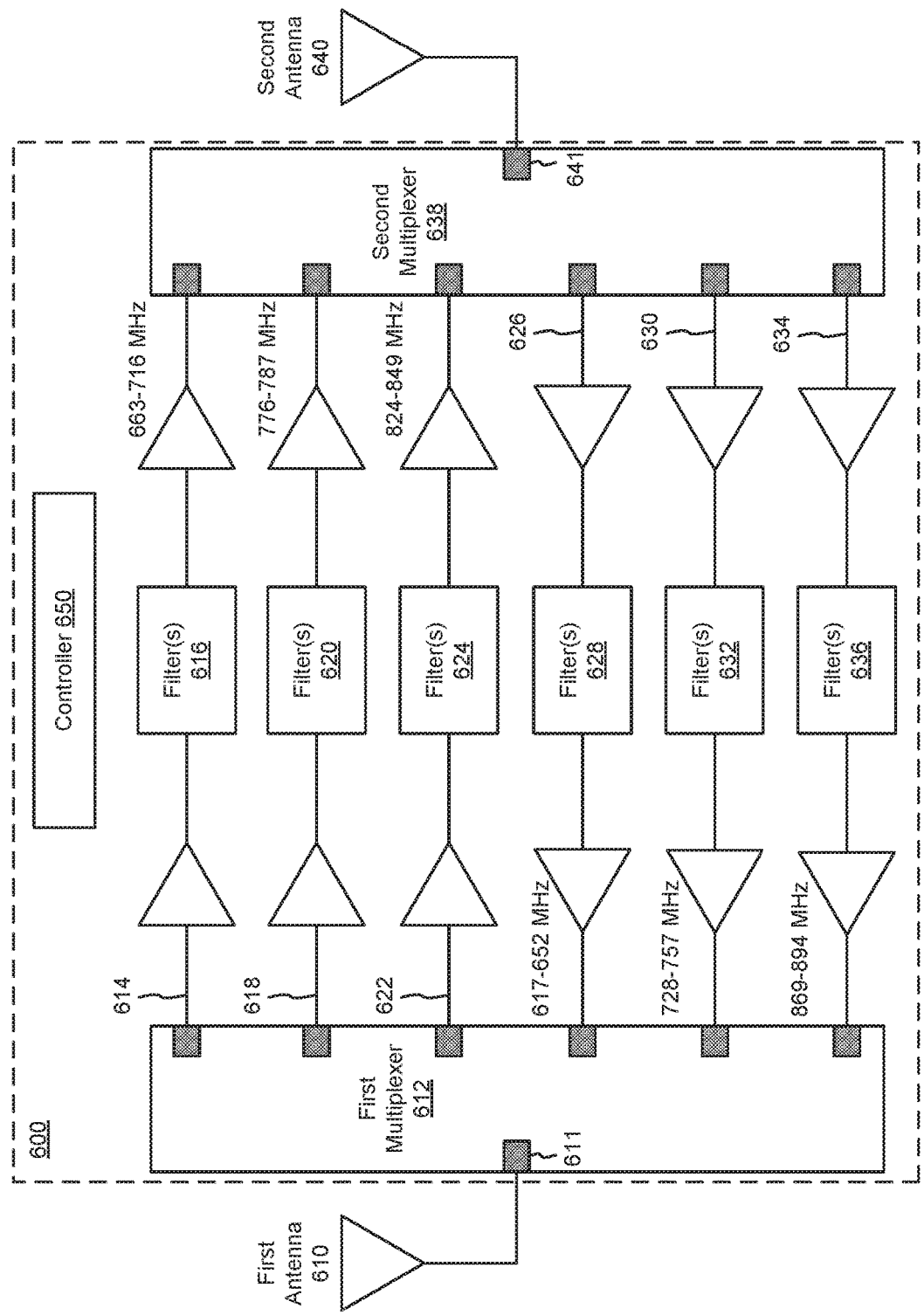
FIG. 6 illustrates a wideband cellular repeater that is compatible with a public safety repeater in a shared area in accordance with an example.

FIG. 6 illustrates an example of a wideband cellular repeater 600. The wideband cellular repeater 600 can be compatible with a public safety repeater (not shown) in a shared area (e.g., in a same building). The cellular repeater 600 can employ sharp filtering (e.g., IF filtering, full-band IF filtering, RF filtering, or digital filtering), such that signals in wideband cellular frequency ranges that are amplified and filtered by the cellular repeater 600 do not cause feedback oscillations for the public safety repeater in the shared area that amplifies and filters signals in public safety frequency ranges that are spectrally adjacent and opposite direction to the signals in the wideband cellular frequency ranges. In addition, the wideband cellular repeater 600 can have no filter overlap (or frequency range overlap) with the public safety repeater.

In one configuration, the wideband cellular repeater 600 can include a first multiplexer 612 and a second multiplexer 638. The first multiplexer 612 can be coupled to a first antenna port 611, which can be communicatively coupled to a first antenna 610. The second multiplexer 638 can be coupled to a second antenna port 641, which can be communicatively coupled to a second antenna 640. The wideband cellular repeater 600 can include a first first-direction amplification and filtering signal path 614, a second first-direction amplification and filtering signal path 618, a third first-direction amplification and filtering signal path 622, a first second-direction amplification and filtering signal path 626, a second second-direction amplification and filtering signal path 630, and a third second-direction amplification and filtering signal path 634, which are each communicatively coupled between the first multiplexer 612 and the second multiplexer 638. In addition, the wideband cellular repeater 600 can include a controller 650 to adjust AGC levels for the first-direction amplification and filtering signal paths 614, 618, 622 and the second-direction amplification and filtering signal paths 626, 630, 634.

Figure 7:
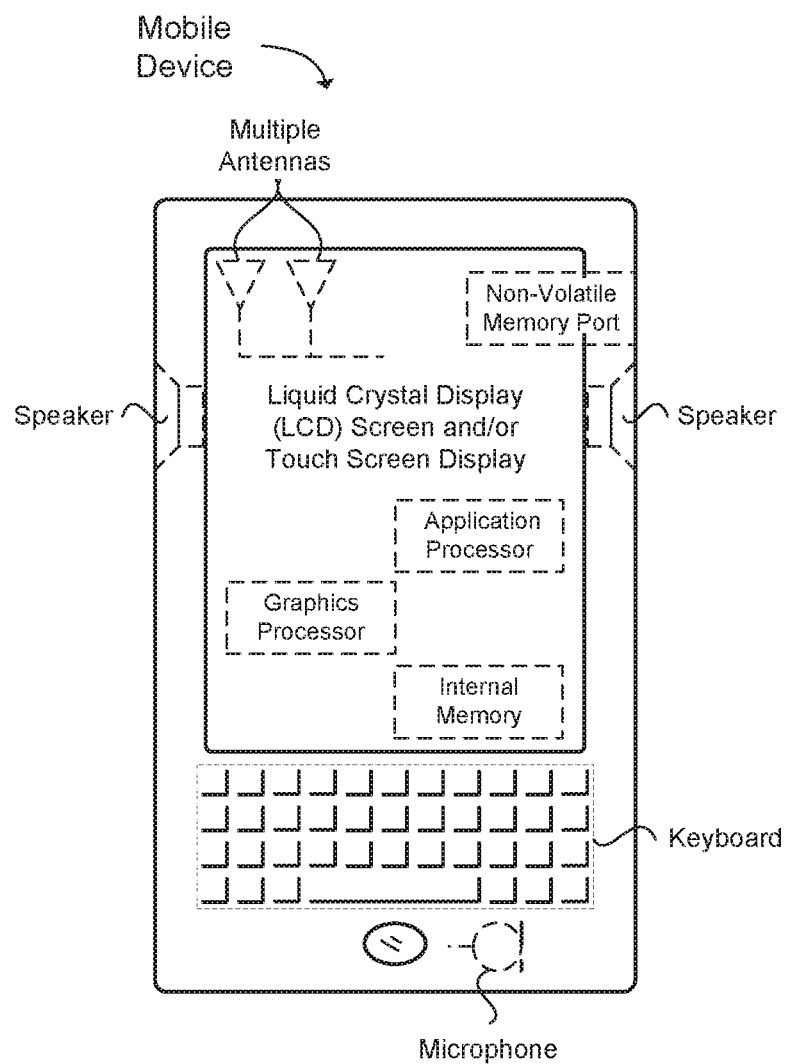
FIG. 7 illustrates a wireless device in accordance with an example.

FIG. 7 provides an example illustration of the wireless device, such as a user equipment (UE), a mobile station (MS), a mobile communication device, a tablet, a handset, a wireless transceiver coupled to a processor, or other type of wireless device. The wireless device can include one or more antennas configured to communicate with a node or transmission station, such as an access point (AP), a base station (BS), an evolved Node B (eNB), a baseband unit (BBU), a remote radio head (RRH), a remote radio equipment (RRE), a relay station (RS), a radio equipment (RE), a remote radio unit (RRU), a central processing module (CPM), or other type of wireless wide area network (WWAN) access point. The wireless device can communicate using separate antennas for each wireless communication standard or shared antennas for multiple wireless communication standards. The wireless device can communicate in a wireless local area network (WLAN), a wireless personal area network (WPAN), and/or a WWAN.

FIG. 7 also provides an illustration of a microphone and one or more speakers that can be used for audio input and output from the wireless device. The display screen can be a liquid crystal display (LCD) screen, or other type of display screen such as an organic light emitting diode (OLED) display. The display screen can be configured as a touch screen. The touch screen can use capacitive, resistive, or another type of touch screen technology. An application processor and a graphics processor can be coupled to internal memory to provide processing and display capabilities. A non-volatile memory port can also be used to provide data input/output options to a user. The non-volatile memory port can also be used to expand the memory capabilities of the wireless device. A keyboard can be with the wireless device or wirelessly connected to the wireless device to provide additional user input. A virtual keyboard can also be provided using the touch screen.

EXAMPLES

The following examples pertain to specific technology embodiments and point out specific features, elements, or actions that can be used or otherwise combined in achieving such embodiments.

Example 1 includes a repeater, comprising: a first common-direction multiplexer; a second common-direction multiplexer; a first-direction signal path communicatively coupled between the first common-direction multiplexer and the second common-direction multiplexer, the first-direction signal path configured to amplify and filter a signal in a first-direction frequency range; a third common-direction multiplexer; a fourth common-direction multiplexer; and a second-direction signal path communicatively coupled between the third common-direction multiplexer and the fourth common-direction multiplexer, the second-direction signal path configured to amplify and filter a signal in a second-direction frequency range that is spectrally adjacent to the first-direction frequency range.

Example 2 includes the repeater of Example 1, wherein: the first-direction frequency range includes one or more first-direction bands; and the second-direction frequency range includes one or more second-direction bands, wherein one or more of the first-direction bands are spectrally adjacent to the one or more of the second-direction bands.

Example 3 includes the repeater of any of Examples 1 to 2, wherein: the first-direction frequency range includes one or more first-direction channels; and the second-direction frequency range includes one or more second-direction channels, wherein one or more of the first-direction channels are spectrally adjacent to the one or more second-direction channels.

Example 4 includes the repeater of any of Examples 1 to 3, further comprising: a first antenna port coupled to the first common-direction multiplexer, and configured to be coupled to a first-direction receive antenna; a second antenna port coupled to the second common-direction multiplexer, and configured to be coupled to a first-direction transmit antenna; a third antenna port coupled to the third common-direction multiplexer, and configured to be coupled to a second-direction receive antenna; and a fourth antenna port coupled to the fourth common-direction multiplexer, and configured to be coupled to a second-direction transmit antenna.

Example 5 includes the repeater of any of Examples 1 to 4, wherein the first-direction receive antenna and the second-direction transmit antenna, and the first-direction transmit antenna and the second-direction receive antenna, are isolated using one or more of spatial isolation, polarization or antenna design to enable amplification and filtering of the first-direction frequency range and the second-direction frequency range, which correspond to spectrally adjacent, opposite-direction frequency ranges.

Example 6 includes the repeater of any of Examples 1 to 5, wherein: the first-direction receive antenna and the second-direction transmit antenna are included in a first antenna package; and the first-direction transmit antenna and the second-direction receive antenna are included in a second antenna package.

Example 7 includes the repeater of any of Examples 1 to 6, wherein: the first common-direction multiplexer and the fourth common-direction multiplexer are communicatively coupled to a circulator, and the circulator is configured to be coupled to a bidirectional antenna; or the second common-direction multiplexer and the third common-direction multiplexer are communicatively coupled to a circulator, and the circulator is configured to be coupled to a bidirectional antenna.

Example 8 includes the repeater of any of Examples 1 to 7, wherein: the first-direction signal path is configured to filter the signal in the first-direction frequency range using intermediate frequency (IF) filtering, and the first-direction signal path is configured to filter out the signal in the second-direction frequency range based on the IF filtering; or the second-direction signal path is configured to filter the signal in the second-direction frequency range using IF filtering, and the second-direction signal path is configured to filter out the signal in the first-direction frequency range based on the IF filtering.

Example 9 includes the repeater of any of Examples 1 to 8, wherein: the first-direction signal path is configured to filter the signal in the first-direction frequency range using digital filtering, and the first-direction signal path is configured to filter out the signal in the second-direction frequency range based on the digital filtering; or the second-direction signal path is configured to filter the signal in the second-direction frequency range using digital filtering, and the second-direction signal path is configured to filter out the signal in the first-direction frequency range based on the digital filtering.

Example 10 includes the repeater of any of Examples 1 to 9, wherein the repeater is configured to: amplify and filter signals in one or more public safety frequency ranges; and amplify and filter signals in one or more cellular frequency ranges, Example 11 includes the repeater of any of Examples 1 to 10, wherein: the one or more public safety frequency ranges include one or more of: 788-805 megahertz (MHz), 806-824 MHz, or 896-901 MHz that correspond to uplink frequency ranges, or 758-775 MHz, 851-869, or 935-940 MHz that corresponds to downlink frequency ranges; and the one or more cellular frequency ranges include one or more of: 663-716 MHz, 698-716 MHz, 776-787 MHz, or 824-849 MHz that corresponds to uplink frequency ranges, or 617-652 MHz, 728-757 MHz, or 869-894 MHz that correspond to downlink frequency ranges.

Example 12 includes the repeater of any of Examples 1 to 11, further comprising a controller configured to: select a first automatic gain control (AGC) level for the one or more public safety frequency ranges; and select a second AGC level for the one or more cellular frequency ranges, wherein AGC levels are selected for the one or more public safety frequency ranges separate from the one or more cellular frequency ranges, wherein the repeater includes separate filtering and amplification signal paths for the one or more public safety frequency ranges and the one or more cellular frequency ranges.

Example 13 includes the repeater of any of Examples 1 to 12, further comprising a controller configured to: perform network protection for the one or more cellular frequency ranges; and determine to not perform network protection for the one or more public safety frequency ranges.

Example 14 includes the repeater of any of Examples 1 to 13, wherein: the first-direction frequency range is an uplink frequency range and the second-direction frequency range is a downlink frequency range; or the first-direction frequency range is a downlink frequency range and the second-direction frequency range is an uplink frequency range.

Example 15 includes the repeater of any of Examples 1 to 14, wherein the repeater is a combined public safety and cellular repeater configured to: amplify a first-direction cellular frequency range that is spectrally adjacent to a second-direction public safety frequency range; or amplify a first-direction public safety frequency range that is spectrally adjacent to a second-direction cellular frequency range.

Example 16 includes a wideband cellular and public safety repeater, comprising: a first multiplexer; a second multiplexer; a first-direction cellular amplification and filtering path coupled between the first multiplexer and the second multiplexer, including one or more of a low noise amplifier (LNA), a filter or a power amplifier (PA), wherein the first-direction cellular amplification and filtering path is configured to amplify and filter a signal in a first-direction cellular band; a third multiplexer; a fourth multiplexer; and a second-direction public safety amplification and filtering path coupled between the third multiplexer and the fourth multiplexer, including one or more of an LNA, a filter or a PA, wherein the second-direction public safety amplification and filtering path is configured to amplify and filter a signal in a second-direction public safety band that is spectrally adjacent to the first-direction cellular band.

Example 17 includes the wideband cellular and public safety repeater of Example 16, wherein the filter in the first-direction cellular amplification and filtering path or the filter in the second-direction public safety amplification and filtering path are intermediate frequency (IF) bandpass filters.

Example 18 includes the wideband cellular and public safety repeater of any of Examples 16 to 17, wherein the filter in the first-direction cellular amplification and filtering path or the filter in the second-direction public safety amplification and filtering path are radio frequency (RF) bandpass filters.

Example 19 includes the wideband cellular and public safety repeater of any of Examples 16 to 18, wherein the filter in the first-direction cellular amplification and filtering path or the filter in the second-direction public safety amplification and filtering path are full-band bandpass filters.

Example 20 includes the wideband cellular and public safety repeater of any of Examples 16 to 19, wherein the filter in the first-direction cellular amplification and filtering path or the filter in the second-direction public safety amplification and filtering path are digital filters.

Example 21 includes the wideband cellular and public safety repeater of any of Examples 16 to 20, further comprising a controller configured to: select an automatic gain control (AGC) level for the one or more cellular bands; and select an AGC level for the one or more public safety bands, wherein the AGC level selected for the one or more cellular bands is separate from the AGC level selected for the one or more public safety bands.

Example 22 includes the wideband cellular and public safety repeater of any of Examples 16 to 21, wherein: the first-direction cellular amplification and filtering path is an uplink cellular signal path and the second-direction public safety amplification and filtering path is a downlink public safety signal path; or the first-direction cellular amplification and filtering path is a downlink cellular signal path and the second-direction public safety amplification and filtering path is an uplink public safety signal path.

Example 23 includes the wideband cellular and public safety repeater of any of Examples 16 to 22, further comprising: a first antenna port coupled to the first multiplexer, and configured to be coupled to a first-direction receive antenna; and a second antenna port coupled to the second multiplexer, and configured to be coupled to a first-direction transmit antenna; a third antenna port coupled to the third multiplexer, and configured to be coupled to a second-direction receive antenna; and a fourth antenna port coupled to the fourth multiplexer, and configured to be coupled to a second-direction transmit antenna.

Example 24 includes the wideband cellular and public safety repeater of any of Examples 16 to 23, wherein the first-direction receive antenna and the second-direction transmit antenna, and the first-direction transmit antenna and the second-direction receive antenna, are isolated using one or more of spatial isolation, polarization or antenna design to enable amplification and filtering of the first-direction cellular band and the second-direction public safety band, which correspond to spectrally adjacent, opposite-direction bands.

Example 25 includes a repeater, comprising: a first multiplexer; a second multiplexer; a first-direction signal path communicatively coupled between the first multiplexer and the second multiplexer, the first-direction signal path configured to amplify and filter a signal in a first-direction band using a first filter; and a second-direction signal path communicatively coupled between the first multiplexer and the second multiplexer, the second-direction signal path configured to amplify and filter a signal in a second-direction band using a second filter, and the second-direction band is spectrally adjacent to the first-direction band, wherein the first filter and the second filter provide filtering to isolate the first-direction band from the spectrally adjacent second-direction band.

Example 26 includes the repeater of Example 25, wherein the first filter or the second filter is one of: an intermediate frequency (IF) bandpass filter, a full-band IF filter, a radio frequency (RF) bandpass filter or a digital filter.

Example 27 includes the repeater of any of Examples 25 to 26, wherein the repeater is a public safety repeater that is compatible with a wideband cellular repeater in a shared area.

Example 28 includes the repeater of any of Examples 25 to 27, wherein the repeater is a wideband cellular repeater that is compatible with a public safety repeater in a shared area.

Example 29 includes a wideband cellular and public safety repeater, comprising: a first-direction cellular amplification and filtering path configured to amplify and filter a signal in a first-direction cellular band using a first filter; a second-direction public safety amplification and filtering path configured to amplify and filter a signal in a second-direction public safety band using a second filter, wherein the second-direction public safety band is spectrally adjacent to the first-direction cellular band, wherein the first filter and the second filter provide filtering to isolate the first-direction band from the spectrally adjacent second-direction band; and a controller operable to select a first automatic gain control (AGC) level for the first-direction cellular band and a second AGC level for the second-direction public safety band that is separate from the first AGC level.

Example 30 includes the wideband cellular and public safety repeater of Example 29, wherein the first filter or the second filter is one of: an intermediate frequency (IF)

bandpass filter, a full-band IF filter, a radio frequency (RF) bandpass filter or a digital filter.

Example 31 includes the wideband cellular and public safety repeater of any of Examples 29 to 30, further comprising: a first antenna port configured to be coupled to a first-direction receive antenna via a first multiplexer; and a second antenna port configured to be coupled to a first-direction transmit antenna via a second multiplexer; a third antenna port configured to be coupled to a second-direction receive antenna via a third multiplexer; and a fourth antenna port configured to be coupled to a second-direction transmit antenna via a fourth multiplexer.

Example 32 includes the wideband cellular and public safety repeater of any of Examples 29 to 31, wherein the first-direction receive antenna and the second-direction transmit antenna, and the first-direction transmit antenna and the second-direction receive antenna, are isolated using one or more of spatial isolation, polarization or antenna design to enable amplification and filtering of the first-direction cellular band and the second-direction public safety band, which correspond to spectrally adjacent, opposite-direction bands.

Various techniques, or certain aspects or portions thereof, can take the form of program code (i.e., instructions) embodied in tangible media, such as floppy diskettes, compact disc-read-only memory (CD-ROMs), hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a random-access memory (RAM), erasable programmable read only memory (EPROM), flash drive, optical drive, magnetic hard drive, solid state drive, or other medium for storing electronic data. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations.

As used herein, the term processor can include general purpose processors, specialized processors such as VLSI, FPGAs, or other types of specialized processors, as well as base band processors used in transceivers to send, receive, and process wireless communications.

It should be understood that many of the functional units described in this specification have been labeled as modules, in order to more particularly emphasize their implementation independence. For example, a module can be implemented as a hardware circuit comprising custom very-large-scale integration (VLSI) circuits or gate arrays, off-the-shelf semiconductors such as logic chips, transistors, or other discrete components. A module can also be implemented in programmable hardware devices such as field programmable gate arrays, programmable array logic, programmable logic devices or the like.

In one example, multiple hardware circuits or multiple processors can be used to implement the functional units described in this specification. For example, a first hardware circuit or a first processor can be used to perform processing operations and a second hardware circuit or a second processor (e.g., a transceiver or a baseband processor) can be used to communicate with other entities. The first hardware circuit and the second hardware circuit can be incorporated into a single hardware circuit, or alternatively, the first hardware circuit and the second hardware circuit can be separate hardware circuits.

Modules can also be implemented in software for execution by various types of processors. An identified module of executable code can, for instance, comprise one or more physical or logical blocks of computer instructions, which can, for instance, be organized as an object, procedure, or function. Nevertheless, the executables of an identified module need not be physically located together, but can comprise disparate instructions stored in different locations which, when joined logically together, comprise the module and achieve the stated purpose for the module.

Indeed, a module of executable code can be a single instruction, or many instructions, and can even be distributed over several different code segments, among different programs, and across several memory devices. Similarly, operational data can be identified and illustrated herein within modules, and can be embodied in any suitable form and organized within any suitable type of data structure. The operational data can be collected as a single data set, or can be distributed over different locations including over different storage devices, and can exist, at least partially, merely as electronic signals on a system or network. The modules can be passive or active, including agents operable to perform desired functions.

Reference throughout this specification to "an example" or "exemplary" means that a particular feature, structure, or characteristic described in connection with the example is included in at least one embodiment of the present invention. Thus, appearances of the phrases "in an example" or the word "exemplary" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics can be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A repeater, comprising:
a first common-direction multiplexer;
a second common-direction multiplexer;
a first-direction signal path coupled between the first common-direction multiplexer and the second common-direction multiplexer, the first-direction signal path configured to amplify and filter a signal in a first-direction frequency range;
a third common-direction multiplexer;
a fourth common-direction multiplexer; and
a second-direction signal path coupled between the third common-direction multiplexer and the fourth common-direction multiplexer, the second-direction signal path configured to amplify and filter a signal in a second-direction frequency range that is spectrally adjacent to the first-direction frequency range.

2. The repeater of claim 1, wherein:
the first-direction frequency range includes one or more first-direction bands; and
the second-direction frequency range includes one or more second-direction bands,
wherein one or more of the first-direction bands are spectrally adjacent to the one or more of the second-direction bands.

3. The repeater of claim 1, wherein:
the first-direction frequency range includes one or more first-direction channels; and
the second-direction frequency range includes one or more second-direction channels,
wherein one or more of the first-direction channels are spectrally adjacent to the one or more second-direction channels.

4. The repeater of claim 1, further comprising:
a first antenna port coupled to the first common-direction multiplexer, and configured to be coupled to a first-direction receive antenna;
a second antenna port coupled to the second common-direction multiplexer, and configured to be coupled to a first-direction transmit antenna;
a third antenna port coupled to the third common-direction multiplexer, and configured to be coupled to a second-direction receive antenna; and
a fourth antenna port coupled to the fourth common-direction multiplexer, and configured to be coupled to a second-direction transmit antenna.

5. The repeater of claim 4, wherein the first-direction receive antenna and the second-direction transmit antenna, and the first-direction transmit antenna and the second-direction receive antenna, are isolated using one or more of spatial isolation, polarization or antenna design to enable amplification and filtering of the first-direction frequency range and the second-direction frequency range, which correspond to spectrally adjacent, opposite-direction frequency ranges.

6. The repeater of claim 4, wherein:
the first-direction receive antenna and the second-direction transmit antenna are included in a first antenna package; and
the first-direction transmit antenna and the second-direction receive antenna are included in a second antenna package.

7. The repeater of claim 1, wherein:
the first common-direction multiplexer and the fourth common-direction multiplexer are coupled to a circulator, and the circulator is configured to be coupled to a bidirectional antenna; or
the second common-direction multiplexer and the third common-direction multiplexer are coupled to a circulator, and the circulator of the second common-direction multiplexer is configured to be coupled to a bidirectional antenna.

8. The repeater of claim 1, wherein:
the first-direction signal path is configured to filter the signal in the first-direction frequency range using intermediate frequency (IF) filtering, and the first-direction signal path is configured to filter out the signal in the second-direction frequency range based on the IF filtering; or
the second-direction signal path is configured to filter the signal in the second-direction frequency range using IF filtering, and the second-direction signal path is configured to filter out the signal in the first-direction frequency range based on the IF filtering in the second-direction frequency range.

9. The repeater of claim 1, wherein:
the first-direction signal path is configured to filter the signal in the first-direction frequency range using digital filtering, and the first-direction signal path is configured to filter out the signal in the second-direction frequency range based on the digital filtering; or
the second-direction signal path is configured to filter the signal in the second-direction frequency range using digital filtering, and the second-direction signal path is configured to filter out the signal in the first-direction frequency range based on the digital filtering in the second-direction frequency range.

10. The repeater of claim 1, wherein the repeater is configured to:
amplify and filter signals in one or more public safety frequency ranges; and
amplify and filter signals in one or more cellular frequency ranges.

11. The repeater of claim 10, wherein:
the one or more public safety frequency ranges include one or more of: 788-805 megahertz (MHz), 806-824 MHz, or 896-901 MHz that correspond to uplink frequency ranges, or 758-775 MHz, 851-869, or 935-940 MHz that corresponds to downlink frequency ranges; and
the one or more cellular frequency ranges include one or more of: 663-716 MHz, 698-716 MHz, 776-787 MHz, or 824-849 MHz that corresponds to uplink frequency ranges, or 617-652 MHz, 728-757 MHz, or 869-894 MHz that correspond to downlink frequency ranges.

12. The repeater of claim 10, further comprising a controller configured to:
select a first automatic gain control (AGC) level for the one or more public safety frequency ranges; and select a second AGC level for the one or more cellular frequency ranges,
wherein AGC levels are selected for the one or more public safety frequency ranges separate from the one or more cellular frequency ranges,
wherein the repeater includes separate filtering and amplification signal paths for the one or more public safety frequency ranges and the one or more cellular frequency ranges.

13. The repeater of claim 10, further comprising a controller configured to:
perform network protection for the one or more cellular frequency ranges; and
determine to not perform network protection for the one or more public safety frequency ranges.

14. The repeater of claim 1, wherein:
the first-direction frequency range is an uplink frequency range and the second-direction frequency range is a downlink frequency range; or
the first-direction frequency range is a downlink frequency range and the second-direction frequency range is an uplink frequency range.

15. The repeater of claim 1, wherein the repeater is a combined public safety and cellular repeater configured to:
amplify a first-direction cellular frequency range that is spectrally adjacent to a second-direction public safety frequency range; or
amplify a first-direction public safety frequency range that is spectrally adjacent to a second-direction cellular frequency range.

16. A wideband cellular and public safety repeater, comprising:
a first multiplexer;
a second multiplexer;
a first-direction cellular amplification and filtering path coupled between the first multiplexer and the second multiplexer, including one or more of a low noise amplifier (LNA), a filter or a power amplifier (PA), wherein the first-direction cellular amplification and filtering path is configured to amplify and filter a signal in a first-direction cellular band;
a third multiplexer;
a fourth multiplexer;
a second-direction public safety amplification and filtering path coupled between the third multiplexer and the fourth multiplexer, including one or more of an LNA, a filter or a PA, wherein the second-direction public safety amplification and filtering path is configured to amplify and filter a signal in a second-direction public safety band that is spectrally adjacent to the first-direction cellular band.

17. The wideband cellular and public safety repeater of claim 16, wherein the filter in the first-direction cellular amplification and filtering path or the filter in the second-direction public safety amplification and filtering path are intermediate frequency (IF) bandpass filters.

18. The wideband cellular and public safety repeater of claim 16, wherein the filter in the first-direction cellular amplification and filtering path or the filter in the second-direction public safety amplification and filtering path are radio frequency (RF) bandpass filters.

19. The wideband cellular and public safety repeater of claim 16, wherein the filter in the first-direction cellular amplification and filtering path or the filter in the second-direction public safety amplification and filtering path are full-band bandpass filters.

20. The wideband cellular and public safety repeater of claim 16, wherein the filter in the first-direction cellular amplification and filtering path or the filter in the second-direction public safety amplification and filtering path are digital filters.

21. The wideband cellular and public safety repeater of claim 16, further comprising a controller configured to:
select an automatic gain control (AGC) level for the one or more cellular bands; and
select an AGC level for the one or more public safety bands,
wherein the AGC level selected for the one or more cellular bands is separate from the AGC level selected for the one or more public safety bands.

22. The wideband cellular and public safety repeater of claim 16, wherein:
the first-direction cellular amplification and filtering path is an uplink cellular signal path and the second-direction public safety amplification and filtering path is a downlink public safety signal path; or
the first-direction cellular amplification and filtering path is a downlink cellular signal path and the second-direction public safety amplification and filtering path is an uplink public safety signal path.

23. The wideband cellular and public safety repeater of claim 16, further comprising:
a first antenna port coupled to the first multiplexer, and configured to be coupled to a first-direction receive antenna; and
a second antenna port coupled to the second multiplexer, and configured to be coupled to a first-direction transmit antenna;
a third antenna port coupled to the third multiplexer, and configured to be coupled to a second-direction receive antenna; and
a fourth antenna port coupled to the fourth multiplexer, and configured to be coupled to a second-direction transmit antenna.

24. The wideband cellular and public safety repeater of claim 23, wherein the first-direction receive antenna and the second-direction transmit antenna, and the first-direction transmit antenna and the second-direction receive antenna, are isolated using one or more of spatial isolation, polarization or antenna design to enable amplification and filtering of the first-direction cellular band and the second-direction public safety band, which correspond to spectrally adjacent, opposite-direction bands.

25. A repeater, comprising:
a first multiplexer;
a second multiplexer;
a first-direction signal path coupled between the first multiplexer and the second multiplexer, the first-direction signal path configured to amplify and filter a signal in a first-direction band using a first filter; and
a second-direction signal path coupled between the first multiplexer and the second multiplexer, the second-direction signal path configured to amplify and filter a signal in a second-direction band using a second filter, and the second-direction band is spectrally adjacent to the first-direction band,
wherein the first filter and the second filter provide filtering to isolate the first-direction band from the spectrally adjacent second-direction band.

26. The repeater of claim 25, wherein the first filter or the second filter is one of: an intermediate frequency (IF) filter, a full-band IF filter, a radio frequency (RF) bandpass filter or a digital filter.

27. The repeater of claim 25, wherein the repeater is a public safety repeater that is compatible with a wideband cellular repeater in a shared area.

28. The repeater of claim 25, wherein the repeater is a wideband cellular repeater that is compatible with a public safety repeater in a shared area.

29. A wideband cellular and public safety repeater, comprising:
- a first-direction cellular amplification and filtering path configured to amplify and filter a signal in a first-direction cellular band using a first filter;
- a second-direction public safety amplification and filtering path configured to amplify and filter a signal in a second-direction public safety band using a second filter, wherein the second-direction public safety band is spectrally adjacent to the first-direction cellular band, wherein the first filter and the second filter provide filtering to isolate the first-direction band from the spectrally adjacent second-direction band; and
- a controller operable to select a first automatic gain control (AGC) level for the first-direction cellular band and a second AGC level for the second-direction public safety band that is separate from the first AGC level.

30. The wideband cellular and public safety repeater of claim 29, wherein the first filter or the second filter is one of: an intermediate frequency (IF) bandpass filter, a full-band IF filter, a radio frequency (RF) bandpass filter or a digital filter.

31. The wideband cellular and public safety repeater of claim 29, further comprising:
- a first antenna port configured to be coupled to a first-direction receive antenna via a first multiplexer; and
- a second antenna port configured to be coupled to a first-direction transmit antenna via a second multiplexer;
- a third antenna port configured to be coupled to a second-direction receive antenna via a third multiplexer; and
- a fourth antenna port configured to be coupled to a second-direction transmit antenna via a fourth multiplexer.

32. The wideband cellular and public safety repeater of claim 29, wherein the first-direction receive antenna and the second-direction transmit antenna, and the first-direction transmit antenna and the second-direction receive antenna, are isolated using one or more of spatial isolation, polarization or antenna design to enable amplification and filtering of the first-direction cellular band and the second-direction public safety band, which correspond to spectrally adjacent, opposite-direction bands.

* * * * *